(12) United States Patent
Niimi et al.

(10) Patent No.: US 8,482,080 B2
(45) Date of Patent: Jul. 9, 2013

(54) ENGINEERED OXYGEN PROFILE IN METAL GATE ELECTRODE AND NITRIDED HIGH-K GATE DIELECTRICS STRUCTURE FOR HIGH PERFORMANCE PMOS DEVICES

(75) Inventors: Hiroaki Niimi, Dallas, TX (US);
Huang-Chun Wen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/475,147

(22) Filed: May 18, 2012

(65) Prior Publication Data
US 2012/0228715 A1    Sep. 13, 2012

Related U.S. Application Data

(62) Division of application No. 12/551,035, filed on Aug. 31, 2009, now Pat. No. 8,202,773.

(60) Provisional application No. 61/092,760, filed on Aug. 29, 2008.

(51) Int. Cl.
*H01L 31/119*    (2006.01)

(52) U.S. Cl.
USPC .................. 257/369; 257/368; 257/388

(58) Field of Classification Search
USPC ............................. 257/368, 369, 388
See application file for complete search history.

(56) References Cited

U.S. PATENT DOCUMENTS

| | | | |
|---|---|---|---|
| 7,612,422 | B2 | 11/2009 | Chambers et al. |
| 2009/0280632 | A1 | 11/2009 | Lin et al. |
| 2009/0302399 | A1 | 12/2009 | Cartier et al. |

*Primary Examiner* — Samuel Gebremariam
(74) *Attorney, Agent, or Firm* — Jacqueline J. Garner; Wade J. Brady, III; Frederick J. Telecky, Jr.

(57) ABSTRACT

A PMOS transistor is disclosed which includes a nitrogen containing barrier to oxygen diffusion between a gate dielectric layer and a metal gate in the PMOS transistor, in combination with a low oxygen region of the metal gate in direct contact with the nitrogen containing barrier and an oxygen rich region of the metal gate above the low oxygen content metal region. The nitrogen containing barrier may be formed by depositing nitrogen containing barrier material on the gate dielectric layer or by nitridating a top region of the gate dielectric layer. The oxygen rich region of the metal gate may be formed by depositing oxidized metal on the low oxygen region of the metal gate or by oxidizing a top region of the low oxygen region of the metal gate.

9 Claims, 27 Drawing Sheets

Engineered Oxygen Profile in Metal Gate Electrode and Nitrided High-K Gate Dielectrics Structure for High Performance PMOS Devices

CROSS REFERENCE TO RELATED APPLICATIONS

This application is a divisional of U.S. Nonprovisional patent application Ser. No. 12/551,035, filed Aug. 31, 2009, and claims the priority of U.S. provisional application Ser. No. 61/092,760, filed Aug. 29, 2008, the contents of which are herein incorporated by reference in its entirety.

FIELD OF THE INVENTION

This invention relates to the field of integrated circuits. More particularly, this invention relates to metal gates in MOS transistors in integrated circuits.

BACKGROUND OF THE INVENTION

Metal gate electrodes are fabricated in metal oxide semiconductor (MOS) transistors in some advanced integrated circuits (ICs) to increase performance parameters such as on-state drive current. It is observed that p-channel metal-oxide-semiconductor (PMOS) transistors with metal gate electrodes may exhibit an increase in threshold voltages as the gate dielectric layer thicknesses decrease to ranges used in high performance complementary metal-oxide-semiconductor (CMOS) ICs, for example below 2 nanometers. Moreover, work functions of metal gates commonly do not match work functions in p-type polycrystalline silicon gate electrodes, leading to less performance than desired from metal gate PMOS transistors.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a p-channel metal-oxide-semiconductor (PMOS) transistor which includes a nitrogen containing barrier to oxygen diffusion between a gate dielectric layer and a metal gate in the PMOS transistor, in combination with a low oxygen region of the metal gate, with a work function above 5 electron volts, and with an oxygen content below 2 percent, and preferably below 1 percent, in contact with the nitrogen containing barrier and an oxygen rich region of the metal gate, also with a work function above 5 electron volts, with an oxygen content above 10 percent, and preferably above 20 percent, in contact with the low oxygen content metal region. The nitrogen containing barrier may reduce oxygen diffusion from the gate dielectric layer to the metal gate, which may reduce threshold increases in PMOS transistors with gate dielectric layers thinner than 2 nanometers. The low oxygen content metal region reduces gate depletion effects while the oxygen rich metal region desirably increases a work function of the metal gate to a value closer to p-type polycrystalline silicon (commonly known as polysilicon) doped above $10^{19}$ cm$^{-3}$.

The nitrogen containing barrier may be formed by depositing a nitrogen containing barrier material on the gate dielectric layer or by nitridating a top region of the gate dielectric layer.

The oxygen rich region of the metal gate may be formed by depositing an oxidized metal layer on the low oxygen region of the metal gate or by oxidizing a top region of the low oxygen region of the metal gate.

An advantage of the inventive PMOS transistor is that it is compatible with planar fabrication processes and with get replacement fabrication processes.

DETAILED DESCRIPTION

Figure 1A:
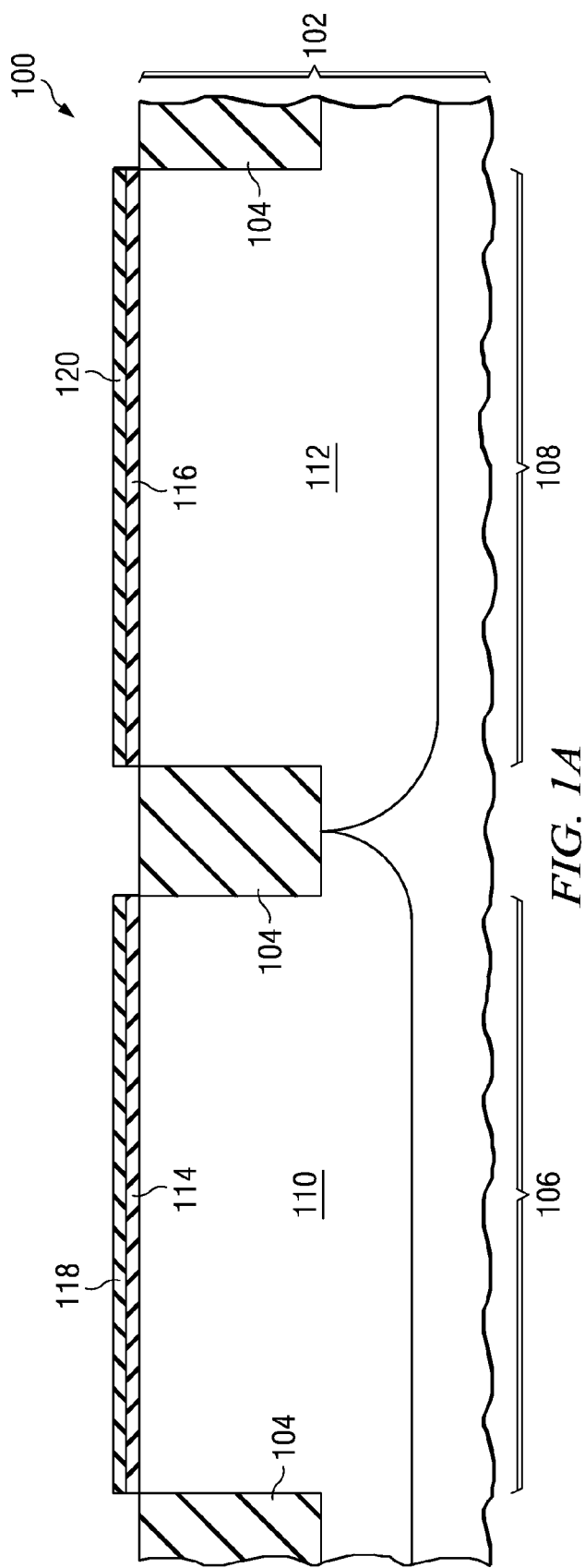
FIG. 1A through FIG. 1J are cross-sections on an IC containing a first embodiment of the instant invention formed by a planar fabrication process sequence, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The problem of threshold increases and work function mismatches in metal gate PMOS transistors with gate dielectric layers thinner than 2 nanometers is addressed by the instant invention, which provides a nitrogen containing barrier to oxygen diffusion between a gate dielectric layer and a metal gate in a p-channel metal oxide semiconductor (PMOS) transistor, in combination with a low oxygen region of the metal gate, with an oxygen content below 2 percent, in contact with the nitrogen containing barrier and an oxygen rich region of the metal gate, with an oxygen content above 10 percent, in contact with the low oxygen content metal region. The nitrogen containing barrier may reduce oxygen diffusion from the gate dielectric layer to the metal gate, which may reduce threshold increases in PMOS transistors with gate dielectric layers thinner than 2 nanometers. The low oxygen content metal region reduces gate depletion effects while the oxygen rich metal region desirably increases a work function of the metal gate to a value closer to p-type polysilicon.

A first embodiment of the instant invention may be formed by a planar fabrication process sequence. A second embodiment may be formed by a gate replacement fabrication process sequence.

FIG. 1A through FIG. 1J are cross-sections on an IC containing a first embodiment of the instant invention formed by a planar fabrication process sequence, depicted in successive stages of fabrication. Referring to FIG. 1A, the IC (100) is formed on a substrate (102) which is commonly a single crystal silicon wafer, but may be a silicon-on-insulator (SOI) wafer, a hybrid orientation technology (HOT) wafer with regions of different crystal orientations, or other material appropriate for fabrication of the IC (100). Elements of field isolation (104) are formed at a top surface of the substrate (102), typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). An element of field isolation (104) separates a region in the IC (100) defined for an n-channel metal oxide semiconductor (NMOS) transistor (106) from a region in the IC (100) defined for a PMOS transistor (108). A p-type well (110), commonly called a p-well, is formed in the substrate (102), typically by ion implanting a p-well set of p-type dopants, including boron and possibly gallium and/or indium, at doses from $1·10^{11}$ to $1·10^{14}$ atoms/cm$^2$, into the NMOS region (106). A p-well photoresist pattern, not shown in FIG. 1A for clarity, is commonly used to block the p-well set of p-type dopants from regions outside the p-well (110). The p-well (110) extends from a top surface of the substrate (102) to a depth typically 50 to 500 nanometers below a bottom surface of the field isolation elements (104). The ion implantation process to form the p-well (110) may include additional steps to implant additional p-type dopants at shallower depths for purposes of improving NMOS transistor performance, such as threshold adjustment, leakage current reduction and suppression of parasitic bipolar operation. An n-type well (112), commonly called an n-well, is formed in the substrate (102), typically by ion implanting an n-well set of n-type dopants, including phosphorus and arsenic, and possibly antimony, at doses from $1·10^{11}$ to $1·10^{14}$ atoms/cm$^2$, into the PMOS region (108). An n-well photoresist pattern, not shown in FIG. 1A for clarity, is commonly used to block the n-well set of n-type dopants from regions outside the n-well (112). The n-well (112) extends from the top surface of the substrate (102) to a depth typically 50 to 500 nanometers below the bottom surface of the field isolation elements (104). The ion implantation process to form the n-well (112) may include additional steps to implant additional n-type dopants at shallower depths for purposes of improving PMOS transistor performance, such as threshold adjustment, leakage current reduction and suppression of parasitic bipolar operation. A sheet resistivity of the n-well (112) is commonly between 100 and 1000 ohms/square.

Continuing to refer to FIG. 1A, an NMOS gate dielectric layer (114) is formed on a top surface of the p-well (110), typically of silicon dioxide, nitrogen doped silicon dioxide, silicon oxy-nitride, hafnium oxide, hafnium silicate, hafnium silicon oxy-nitride, layers of silicon dioxide and silicon nitride, or other high-dielectric-constant (high-k) dielectric material, and typically between 1 and 3 nanometers thick, using any of a variety of gate dielectric formation process, for example thermal oxidation, plasma nitridation of an oxide layer, and/or dielectric material deposition by atomic layer deposition (ALD) processes. A PMOS gate dielectric layer (116) is formed on a top surface of the n-well (112), with similar properties as the NMOS gate dielectric layer (114). It is common to form portions or all of the NMOS gate dielectric layer (114) and PMOS gate dielectric layer (116) concurrently.

Still referring to FIG. 1A, an optional NMOS nitrogen containing barrier layer (118) is formed on a top surface of the NMOS gate dielectric layer (114). A PMOS nitrogen containing barrier layer (120) is formed on a top surface of the PMOS gate dielectric layer (116). The NMOS nitrogen containing barrier layer (118), if formed, is preferably formed concurrently with the PMOS nitrogen containing barrier layer (120). The PMOS nitrogen containing barrier layer (120) may be formed by growing or depositing a layer of nitrogen containing barrier material on the top surface of the PMOS gate dielectric layer (116), or may be formed by nitridating a top region of the PMOS gate dielectric layer (116). In a preferred embodiment, a thickness of the PMOS nitrogen containing barrier layer (120) is between 0.3 and 0.5 nanometers.

Figure 1B:
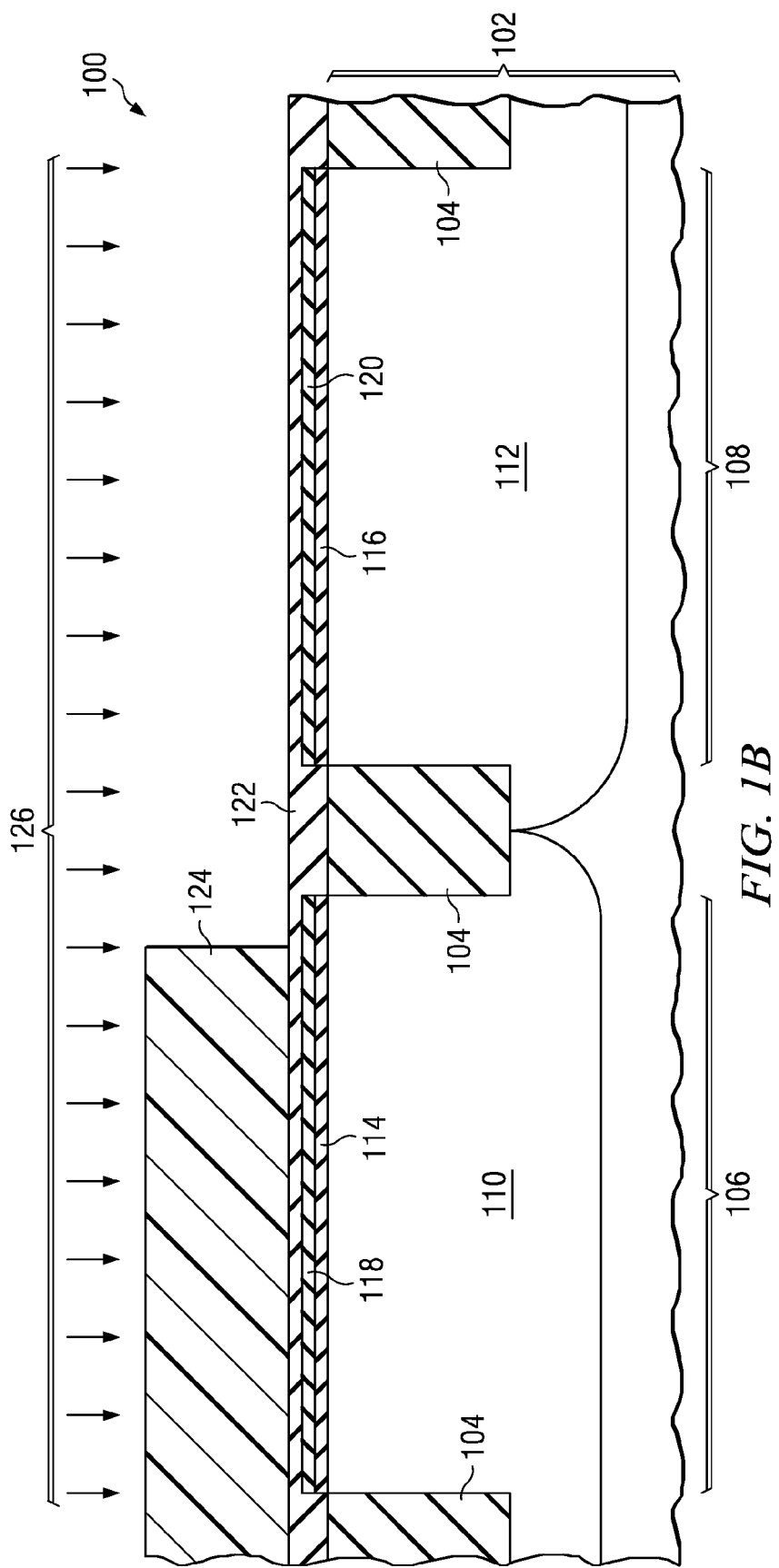

FIG. 1B depicts the IC (100) during formation of an NMOS metal gate. An NMOS metal gate layer (122), possibly titanium nitride or tantalum silicon nitride, preferably between 1 and 10 nanometers thick, is formed on a top surface of the NMOS nitrogen containing barrier layer (118) and a top surface of the PMOS nitrogen containing barrier layer (120). The NMOS metal gate layer (122) may be formed by physical vapor deposition (PVD) processes, metal-organic chemical vapor deposition (MOCVD) process, ALD processes or other methods. An NMOS metal gate layer photoresist pattern (124) is formed on a top surface of the NMOS metal gate layer (122) to define an area for the NMOS metal gate in the NMOS region (106). A NMOS metal gate layer reactive ion etch process (126), for example a plasma containing halogens such as fluorine or chlorine, removes unwanted NMOS metal gate material from areas exposed by the NMOS metal gate layer photoresist pattern (124). In a preferred embodiment, substantially all the unwanted NMOS metal gate material is removed from areas exposed by the NMOS metal gate layer photoresist pattern (124) and substantially none of the PMOS nitrogen containing barrier layer (120) is removed by the NMOS metal gate layer reactive ion etch process (126). The NMOS metal gate layer photoresist pattern (124) is removed in subsequent processing, for example by exposing the IC (100) to an oxygen containing plasma, followed by a wet cleanup to remove any organic residue from the top surface of the NMOS metal gate layer (122).

Figure 1C:
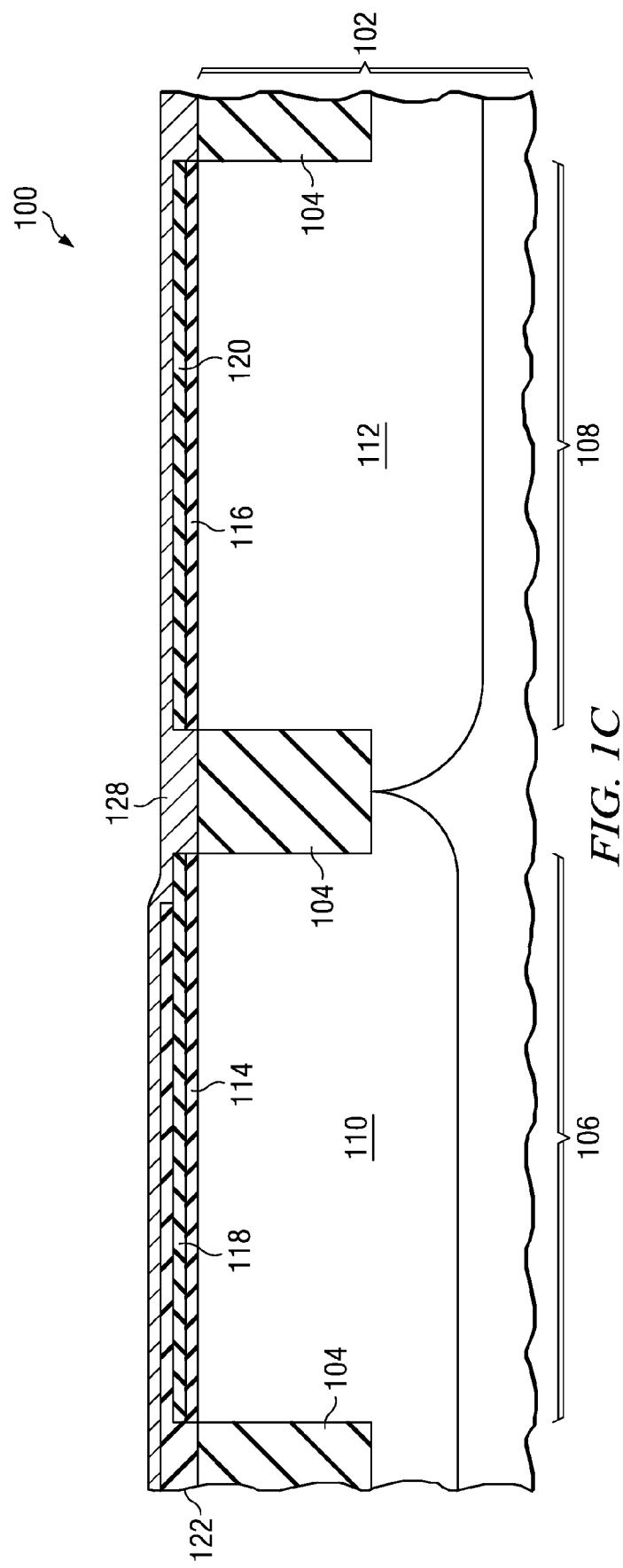

FIG. 1C depicts the IC (100) after formation of a PMOS low oxygen metal layer (128) on the top surface of the PMOS nitrogen containing barrier layer (120) and a top surface of the NMOS metal gate layer (122). The PMOS low oxygen metal layer (128) is preferably formed of a metal or a mixture of metals with a work function greater than 5 electron volts, for example palladium, tungsten, molybdenum, ruthenium, nickel and/or iridium. An oxygen concentration in the PMOS low oxygen metal layer (128) is below 2 percent, and preferably below 1 percent. The PMOS low oxygen metal layer (128) is preferably between 0.5 and 2 nanometers thick, and is preferably formed by ALD processes, but may be formed by PVD, MOCVD or other deposition processes.

Figure 1D:
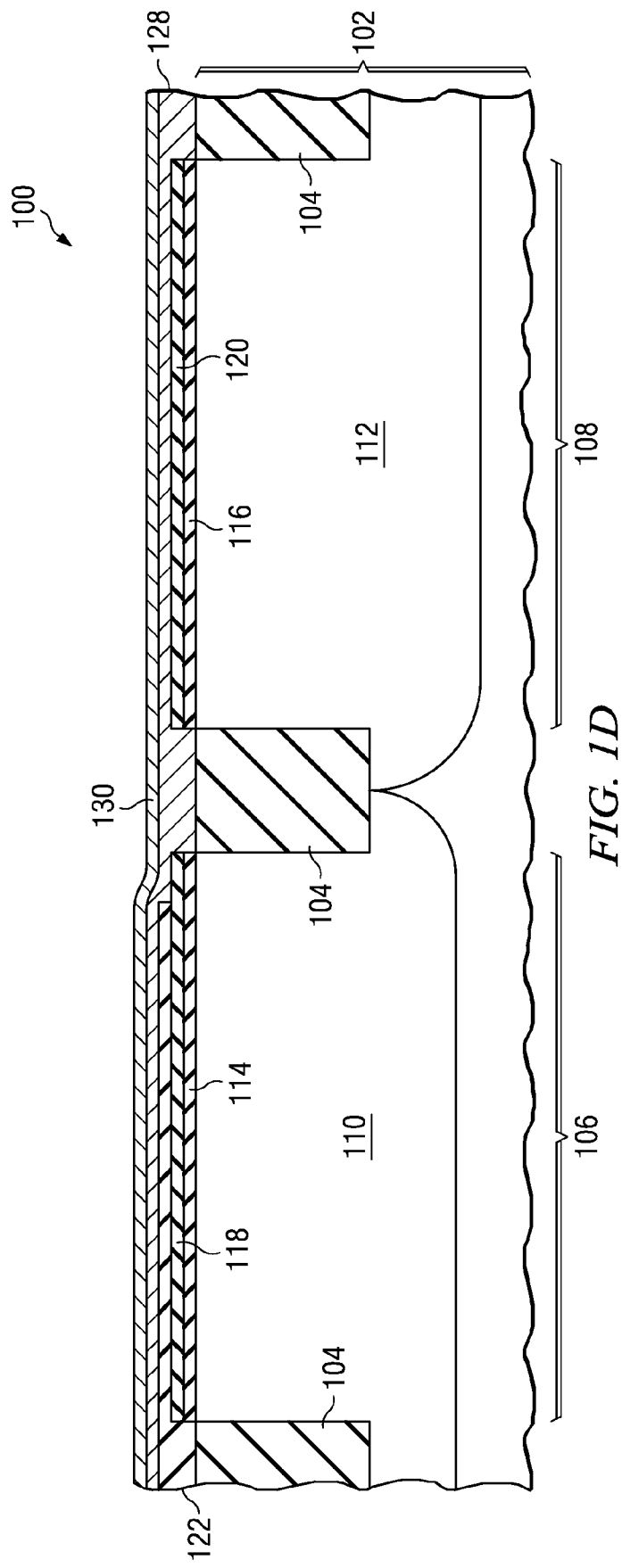

FIG. 1D depicts the IC (100) after formation of a PMOS oxygen rich metal layer (130), for example, oxygen rich palladium, oxygen rich tungsten, oxygen rich molybdenum, oxygen rich ruthenium, oxygen rich nickel and/or oxygen rich iridium, on a top surface of the PMOS low oxygen metal layer (128). The PMOS oxygen rich metal layer (130) may be formed by depositing an oxygen rich layer of metal on the top surface of the PMOS low oxygen metal layer (128), or may be formed by oxidizing a top region of the PMOS low oxygen metal layer (128). In a preferred embodiment, an oxygen concentration in the PMOS oxygen rich metal layer (130) is greater than 20 percent, but may be as low as 10 percent. In a preferred embodiment, a thickness of the PMOS oxygen rich metal layer (130) is between 0.5 and 2 nanometers.

Figure 1E:
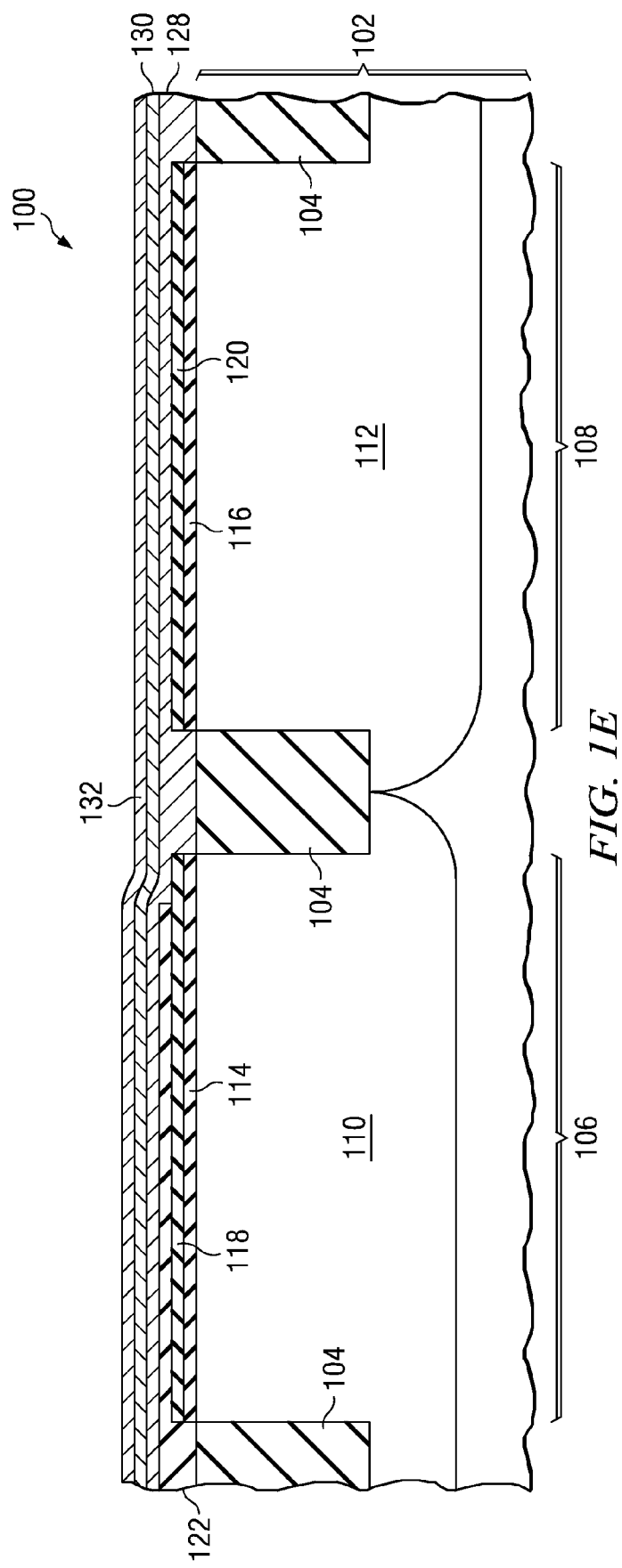

FIG. 1E depicts the IC (100) after formation of a PMOS top metal gate layer (132), preferably of a same composition as the PMOS low oxygen metal layer (128), but possibly another metal or mixture of metals with a work function greater than 5 electron volts, on a top surface of the PMOS oxygen rich metal layer (130). The PMOS top metal gate layer (132) is preferably formed by ALD processes, but may be formed by PVD, MOCVD or other deposition processes. In a preferred embodiment, a thickness of the PMOS top metal gate layer (132) is between 0.5 and 2 nanometers.

Figure 1F:
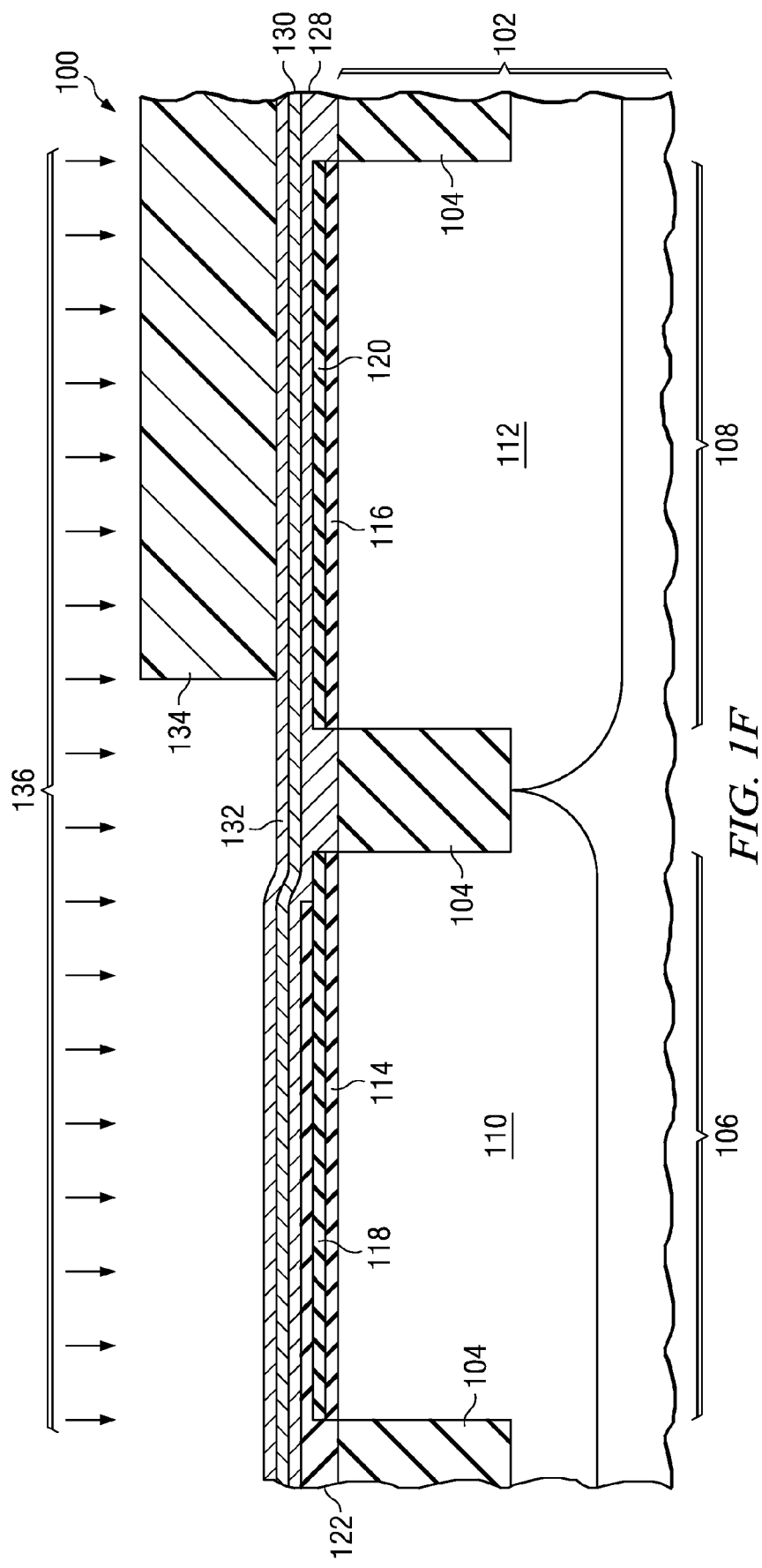

FIG. 1F depicts the IC (100) during formation of a PMOS metal gate stack. A PMOS metal gate stack photoresist pattern (134) is formed on a top surface of the PMOS top metal gate layer (132) to define an area for the PMOS metal gate stack in the PMOS region (108). A PMOS metal gate stack reactive ion etch process (136) removes unwanted material from the PMOS top metal gate layer (132), the PMOS oxygen rich metal layer (130) and the PMOS low oxygen metal layer (128). In a preferred embodiment, the PMOS metal gate stack reactive ion etch process (136) includes three reactive ion etch steps in which gas species, RF power and other process parameters in each step are adjusted to provide clean removal of the PMOS top metal gate layer (132), the PMOS oxygen rich metal layer (130) and the PMOS low oxygen metal layer (128). In a preferred embodiment, substantially all the unwanted PMOS metal gate stack material is removed from areas exposed by the PMOS metal gate stack photoresist pattern (134) and substantially none of the NMOS metal gate layer (122) is removed by the PMOS metal gate stack reactive ion etch process (136). The PMOS metal gate stack photoresist pattern (134) is removed in subsequent processing, for example by exposing the IC (100) to an oxygen containing plasma, followed by a wet cleanup to remove any organic residue from the top surface of the PMOS top metal gate layer (132).

Figure 1G:
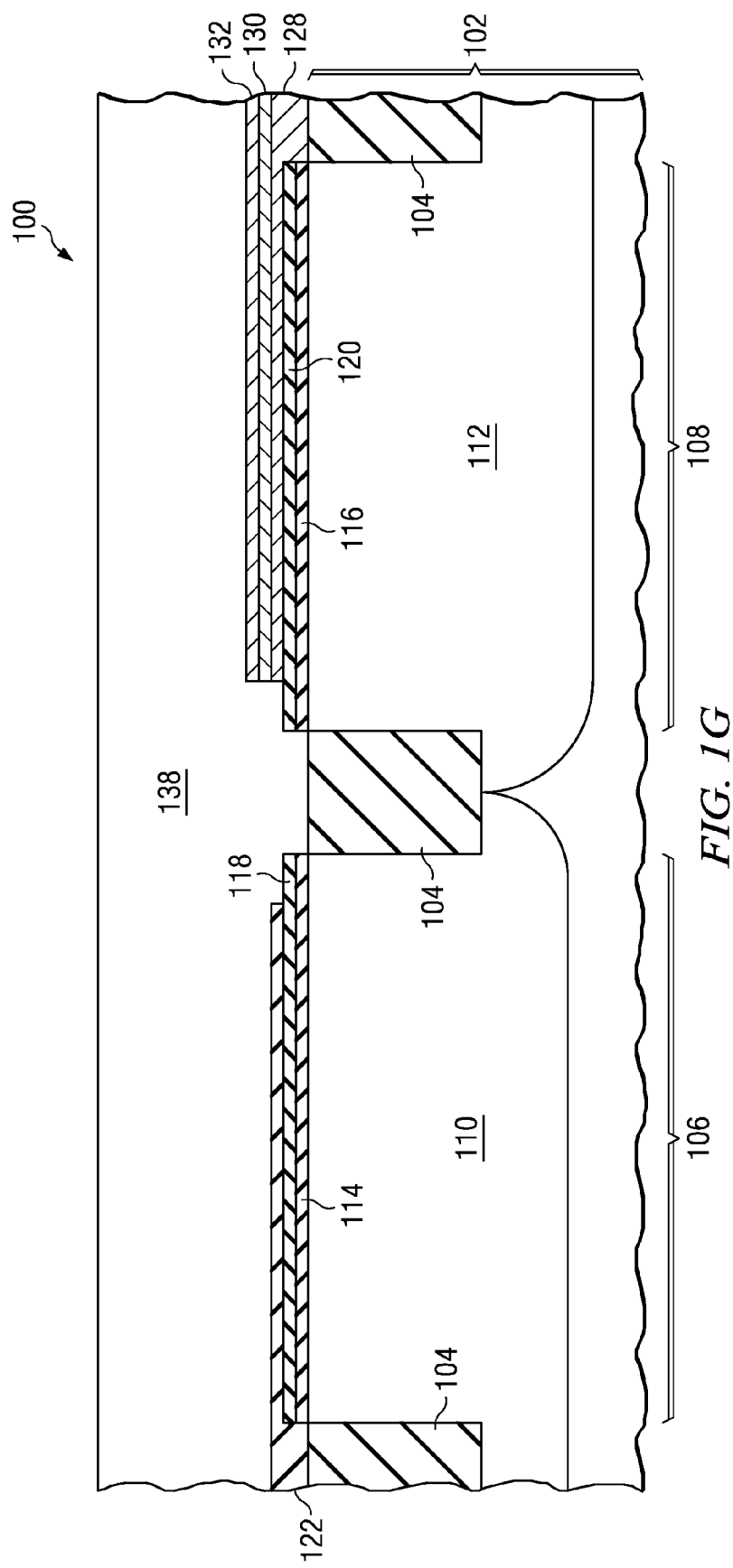

FIG. 1G depicts the IC (100) after formation of a layer of polycrystalline silicon (138), commonly known as polysilicon, on the top surface of the NMOS metal gate layer (122) and the top surface of the PMOS top metal gate layer (132). The polysilicon layer (138) is preferably between 40 and 100 nanometers thick, and may be undoped or doped n-type or p-type. Formation of the polysilicon layer (138) is preferably performed using known methods of polysilicon gate layer deposition as commonly used in CMOS IC fabrication.

Figure 1H:
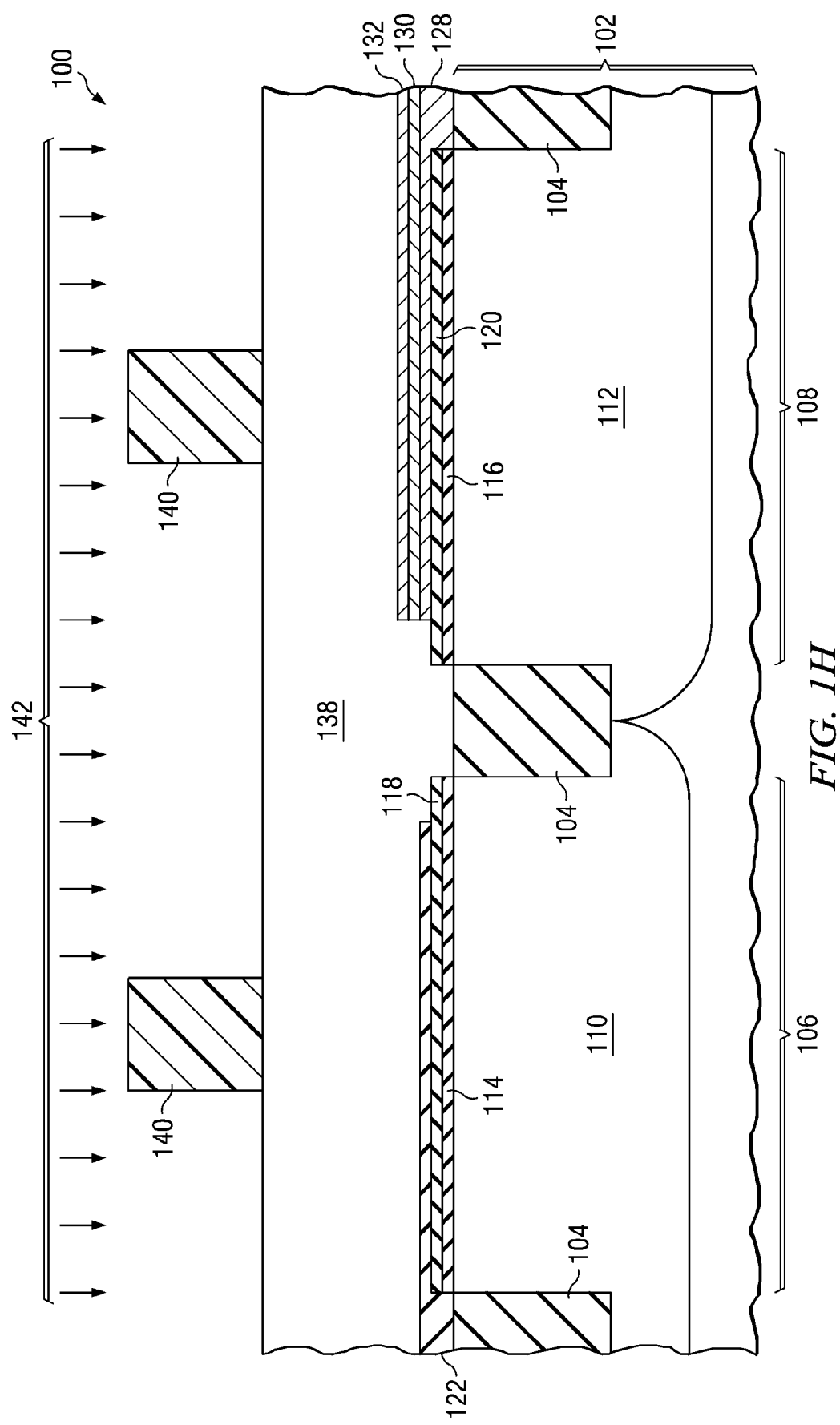

FIG. 1H depicts the IC (100) during a gate etch process. A gate photoresist pattern (140) is formed on a top surface of the polysilicon layer (138) to define areas for an NMOS gate in the NMOS region (106) and a PMOS gate in the PMOS region (108). A lateral width of the NMOS gate area is less than a lateral width of the NMOS metal gate layer (122) and a lateral width of the PMOS gate area is less than a lateral width of the PMOS metal gate stack. A gate etch process (142) removes unwanted material from the polysilicon layer (138), the PMOS top metal gate layer (132), the PMOS oxygen rich metal layer (130), the PMOS low oxygen metal layer (128), the NMOS metal gate layer (122), the PMOS nitrogen containing barrier layer (120), the NMOS nitrogen containing barrier layer (118), the PMOS gate dielectric layer (116) and the NMOS gate dielectric layer (114). In a preferred embodiment, the gate etch process (142) includes four or more reactive ion etch steps in which gas species, RF power and other process parameters in each step are adjusted to provide clean removal of the polysilicon layer (138), the PMOS top metal gate layer (132), the PMOS oxygen rich metal layer (130), the PMOS low oxygen metal layer (128), the NMOS metal gate layer (122), the PMOS nitrogen containing barrier layer (120), the NMOS nitrogen containing barrier layer (118), the PMOS gate dielectric layer (116) and the NMOS gate dielectric layer (114). In a preferred embodiment, substantially all the unwanted material in the polysilicon layer (138), the PMOS top metal gate layer (132), the PMOS oxygen rich metal layer (130), the PMOS low oxygen metal layer (128), the NMOS metal gate layer (122), the PMOS nitrogen containing barrier layer (120), the NMOS nitrogen containing barrier layer (118), the PMOS gate dielectric layer (116) and the NMOS gate dielectric layer (114) is removed while substantially none of the substrate (102) in the p-well (110) or the n-well (112) is removed. The gate photoresist pattern (140) may be partially or completely removed by the gate etch process (142) or may be removed during subsequent processing, for example by exposing the IC (100) to an oxygen containing plasma, followed by a wet cleanup to remove any organic residue from the top surface of the polysilicon (138).

Figure 1I:
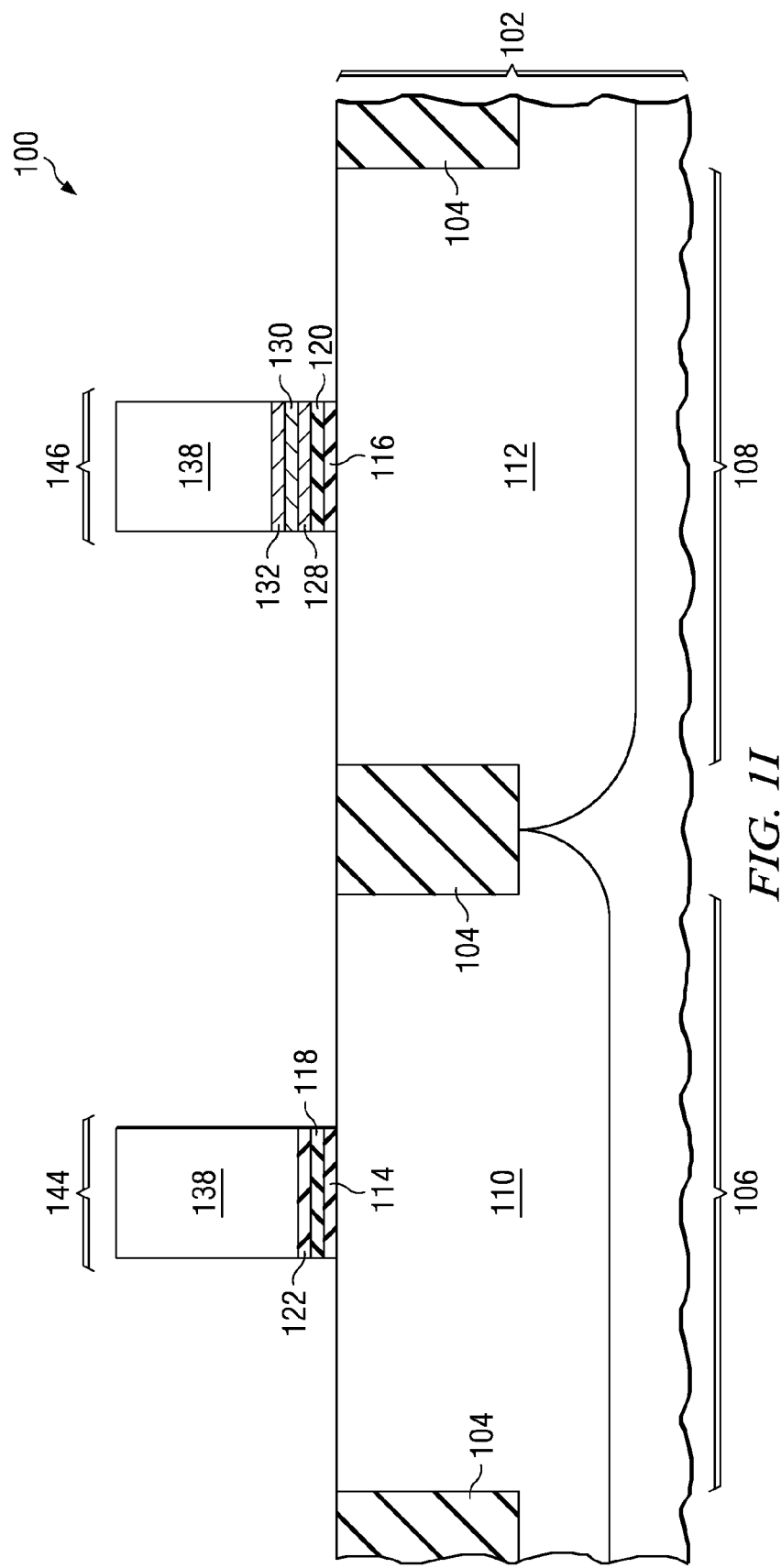

FIG. 1I depicts the IC (100) after the gate etch process is completed. An NMOS gate stack (144) is formed in the NMOS transistor region (106) by the gate etch process, and includes the NMOS gate dielectric layer (114), the NMOS nitrogen containing barrier layer (118), the NMOS metal gate layer (122) and the polysilicon layer (138). A PMOS gate stack (146) is formed in the PMOS transistor region (108) by the gate etch process, and includes the PMOS gate dielectric layer (116), the PMOS nitrogen containing barrier layer (120), the PMOS low oxygen metal layer (128), the PMOS oxygen rich metal layer (130), the PMOS top metal gate layer (132) and the polysilicon layer (138).

Figure 1J:
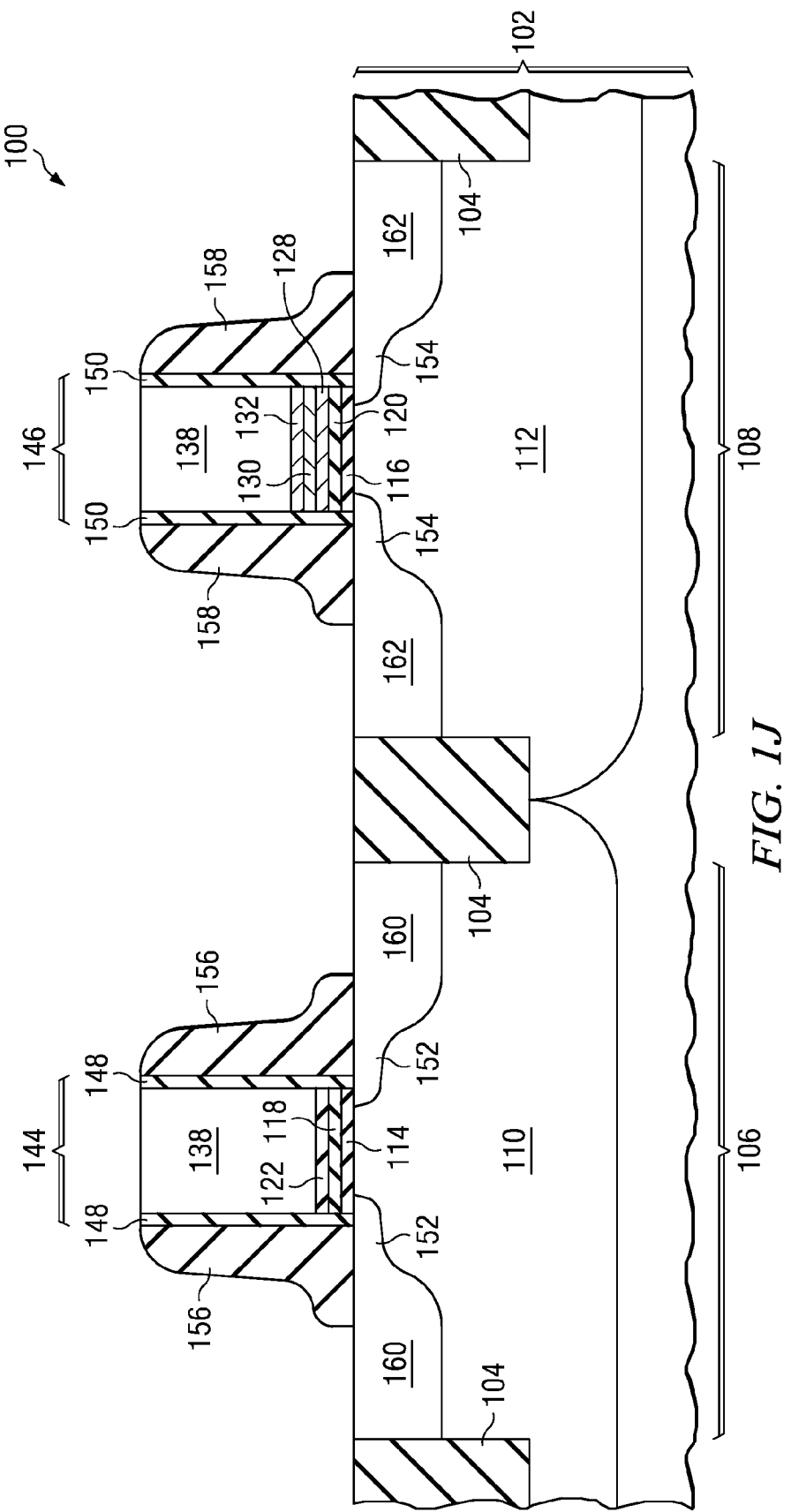

Referring to FIG. 1J, fabrication of the IC (100) continues with formation of NMOS offset spacers (148) on lateral surfaces of the NMOS gate stack (144), by oxidation of exposed surfaces of the NMOS gate stack (144) or by conformal deposition and etchback of one or more layers of silicon dioxide and/or silicon nitride. The NMOS offset spacers (148) are preferably between 3 and 30 nanometers thick. PMOS offset spacers (150), between 3 and 30 nanometers thick, are formed on lateral surfaces of the PMOS gate stack (146) in a similar manner. The thickness of the NMOS offset spacers (148) is not necessarily substantially equal to the thickness of the PMOS offset spacers (150). A portion of the NMOS offset spacers (148) and a portion of the PMOS offset spacers (150) may be formed concurrently. N-type lightly doped drain (NLDD) regions (152) are formed in the p-well (110) adjacent to the NMOS offset spacers (148) by ion implanting an NLDD set of n-type dopants into the p-well (110) in the NMOS transistor region (106) to a depth between 10 and 30 nanometers. Optional p-type halo regions, not shown in FIG. 1J for clarity, may be formed in the p-well (110) abutting the NLDD regions (152) under the NMOS gate dielectric layer (114) by ion implanting an NMOS halo set of p-type dopants at an angle between 10 and 30 degrees into the p-well (110) in the NMOS transistor region (106) to a depth between 20 and 40 nanometers. P-type lightly doped drain (PLDD) regions (154) are formed in the n-well (112) adjacent to the PMOS offset spacers (150) by ion implanting a PLDD set of p-type dopants into the n-well (112) in the PMOS transistor region (108) to a depth between 10 and 30 nanometers. Optional n-type halo regions, not shown in FIG. 1J for clarity, may be formed in the n-well (112) abutting the PLDD regions (154) under the PMOS gate dielectric layer (116) by ion implanting a PMOS halo set of n-type dopants at an angle between 10 and 30 degrees into the n-well (112) in the PMOS transistor region (108) to a depth between 20 and 40 nanometers.

Continuing to refer to FIG. 1J, NMOS gate sidewall spacers (156) are formed on lateral surfaces of the NMOS offset spacers (148), typically by deposition of one or more conformal layers of silicon nitride and/or silicon dioxide on an existing top surface of the IC (100), followed by removal of the conformal layer material from the top surface of the NMOS gate stack (144) and the top surface of the p-well (110) by known anisotropic etching methods, leaving the conformal layer material on the lateral surfaces of the NMOS offset spacers (148). A lateral thickness of the NMOS gate sidewall spacers (156) is preferably between 40 and 100 nanometers thick at the top surface of the p-well (110). PMOS gate sidewall spacers (158) are formed on lateral surfaces of the PMOS offset spacers (150), also typically by deposition of one or more conformal layers of silicon nitride and/or silicon dioxide on an existing top surface of the IC (100), followed by removal of the conformal layer material from the top surface of the PMOS gate stack (146) and the top surface of the n-well (112) by known anisotropic etching methods, leaving the conformal layer material on the lateral surfaces of the PMOS offset spacers (150). A lateral thickness of the PMOS gate sidewall spacers (158) is preferably between 40 and 100 nanometers thick at the top surface of the n-well (112). The thickness of the NMOS gate sidewall spacers (156) is not necessarily substantially equal to the thickness of the PMOS gate sidewall spacers (158). A portion of the NMOS gate sidewall spacers (156) and a portion of the PMOS gate sidewall spacers (158) may be formed concurrently. N-type source and drain (NSD) regions (160) are formed in the p-well (110) abutting the NLDD regions (152) adjacent to the NMOS gate sidewall spacers (156) by ion implanting an NSD set of n-type dopants into the p-well (110) in the NMOS transistor region (106) to a depth between 30 and 100 nanometers. P-type source and drain (PSD) regions (162) are formed in the n-well (112) abutting the PLDD regions (154) adjacent to the PMOS gate sidewall spacers (158) by ion implanting a PSD set of p-type dopants into the n-well (112) in the PMOS transistor region (108) to a depth between 30 and 100 nanometers. Fabrication of the IC (100) is continued using known fabrication practices.

The PMOS nitrogen containing barrier layer (120) desirably reduces oxygen diffusion between the PMOS metal gate layers (128, 130, 132) and the PMOS gate dielectric layer (116), which may improve on-state drive current, especially if the PMOS gate dielectric layer (116) is thinner than 2 nanometers. An oxygen concentration in the PMOS low oxygen metal layer (128) below 1 percent also desirably reduces oxygen diffusion between the PMOS metal gate layers (128, 130, 132) and the PMOS gate dielectric layer (116). An oxygen concentration in the PMOS oxygen rich metal layer (130) above $1 \cdot 10^{14}$ atoms/cm$^2$ desirably increases a work function of the PMOS metal gate layers (128, 130, 132) by 0.2 to 0.3 electron volts.

The embodiment discussed in reference to FIG. 1A through FIG. 1J is advantageous because the processes to form the inventive PMOS gate stack may be integrated into a planar fabrication process sequence of the IC (100) using conventional semiconductor processing equipment.

Figure 2A:
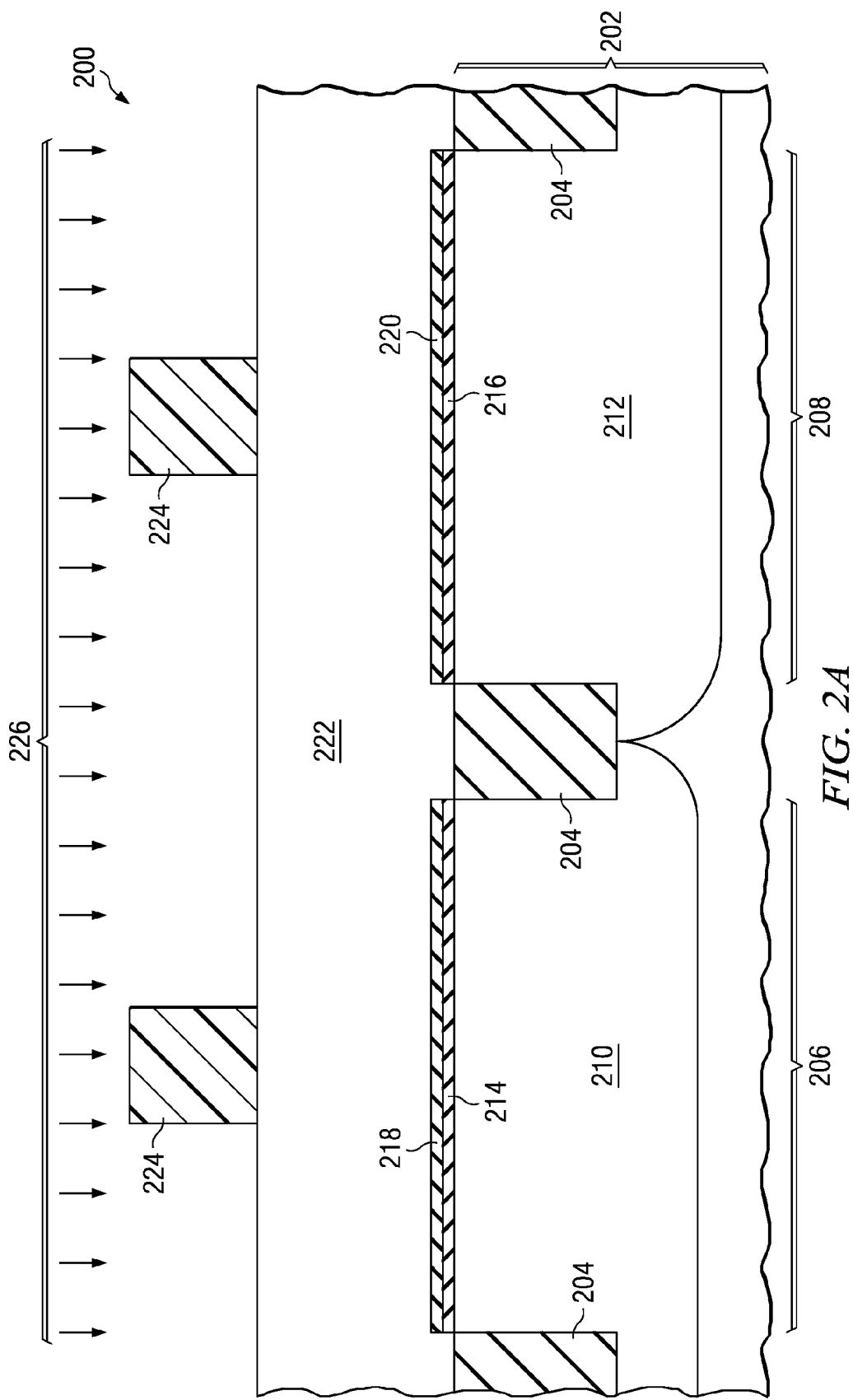
FIG. 2A through FIG. 2H are cross-sections on an IC containing a second embodiment of the instant invention formed by a gate replacement fabrication process sequence, depicted in successive stages of fabrication.

FIG. 2A through FIG. 2H are cross-sections on an IC containing a second embodiment of the instant invention formed by a gate replacement fabrication process sequence, depicted in successive stages of fabrication. Referring to FIG. 2A, the IC (200) is formed on a substrate (202) which has the properties described in reference to FIG. 1A. Elements of field isolation (204) are formed in the substrate (202) as described in reference to FIG. 1A. An element of field isolation (204) separates a region in the IC (200) defined for an NMOS transistor (206) from a region in the IC (200) defined for a PMOS transistor (208). A p-well (210) is formed in the substrate (202) in the NMOS region (206), as described in reference to FIG. 1A. Similarly, an n-well (212) is formed in the substrate (202) in the PMOS region (208), as described in reference to FIG. 1A. An NMOS gate dielectric layer (214) is formed on a top surface of the p-well (210), with the properties described in reference to FIG. 1A. A PMOS gate dielectric layer (216) is formed on a top surface of the n-well (212), with the properties described in reference to FIG. 1A. An optional NMOS nitrogen containing barrier layer (218) is formed on a top surface of the NMOS gate dielectric layer (214) and a PMOS nitrogen containing barrier layer (220) is formed on a top surface of the PMOS gate dielectric layer (216), as described in reference to FIG. 1A.

A polysilicon layer (222) preferably between 40 and 100 nanometers thick is formed on an existing top surface of the IC (200), preferably using methods of polysilicon gate layer deposition commonly used in CMOS IC fabrication. The polysilicon layer (222) is preferably undoped in the instant embodiment. A gate photoresist pattern (224) is formed on a top surface of the polysilicon layer (222) to define areas for an NMOS gate in the NMOS region (206) and a PMOS gate in the PMOS region (208). A gate etch process (226) removes unwanted material from the polysilicon layer (222), the PMOS nitrogen containing barrier layer (220), the NMOS nitrogen containing barrier layer (218), the PMOS gate dielectric layer (216) and the NMOS gate dielectric layer (214). In a preferred embodiment, substantially all the unwanted material in the polysilicon layer (222), the PMOS nitrogen containing barrier layer (220), the NMOS nitrogen containing barrier layer (218), the PMOS gate dielectric layer (216) and the NMOS gate dielectric layer (214) is removed while substantially none of the substrate (202) in the p-well (210) or the n-well (212) is removed. The gate photoresist pattern (224) may be partially or completely removed by the gate etch process (226) or may be removed during subsequent processing, for example by exposing the IC (200) to an oxygen containing plasma, followed by a wet cleanup to remove any organic residue from the top surface of the polysilicon (222).

Figure 2B:
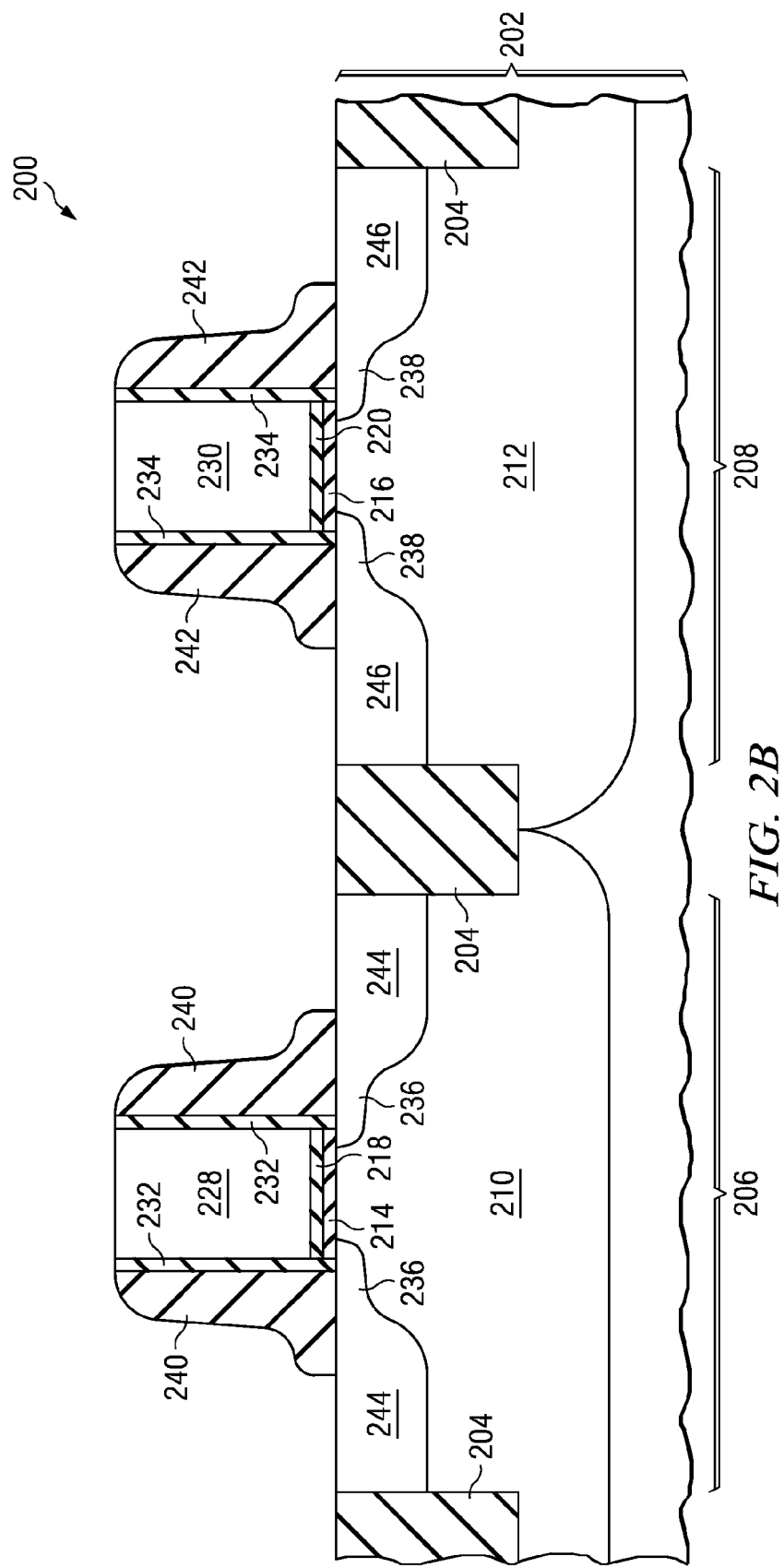

FIG. 2B depicts the IC (200) at a subsequent stage of fabrication. A dummy NMOS gate stack includes the NMOS gate dielectric layer (214), the NMOS nitrogen containing barrier layer (218) and an NMOS polysilicon gate (228). A dummy PMOS gate stack includes the PMOS gate dielectric layer (216), the PMOS nitrogen containing barrier layer (220) and a PMOS polysilicon gate (230). NMOS offset spacers (232) are formed on lateral surfaces of the dummy NMOS gate stack by oxidation of exposed surfaces of the dummy NMOS gate stack or by conformal deposition and etchback of one or more layers of silicon dioxide and/or silicon nitride. The NMOS offset spacers (232) are preferably between 3 and 30 nanometers thick. PMOS offset spacers (234) are formed on lateral surfaces of the dummy PMOS gate stack by oxidation of exposed surfaces of the dummy PMOS gate stack or by conformal deposition and etchback of one or more layers of silicon dioxide and/or silicon nitride. The PMOS offset spacers (234) are preferably between 3 and 30 nanometers thick. The thickness of the NMOS offset spacers (232) is not necessarily substantially equal to the thickness of the PMOS offset spacers (234). A portion of the NMOS offset spacers (232) and a portion of the PMOS offset spacers (234) may be formed concurrently.

Fabrication of the IC (200) continues with formation of n-type lightly doped drain (NLDD) regions (236) in the p-well (210) adjacent to the NMOS offset spacers (232) by ion implanting an NLDD set of n-type dopants into the p-well (210) in the NMOS transistor region (206) to a depth between 10 and 30 nanometers. Optional p-type halo regions, not shown in FIG. 2B for clarity, may be formed in the p-well (210) abutting the NLDD regions (236) under the NMOS gate dielectric layer (214) by ion implanting an NMOS halo set of p-type dopants at an angle between 10 and 30 degrees into the p-well (210) in the NMOS transistor region (206) to a depth between 20 and 40 nanometers. P-type lightly doped drain (PLDD) regions (238) are formed in the n-well (212) adjacent to the PMOS offset spacers (234) by ion implanting a PLDD set of p-type dopants into the n-well (212) in the PMOS transistor region (208) to a depth between 10 and 30 nanometers. Optional n-type halo regions, not shown in FIG. 2B for clarity, may be formed in the n-well (212) abutting the PLDD regions (238) under the PMOS gate dielectric layer (216) by ion implanting a PMOS halo set of n-type dopants at an angle between 10 and 30 degrees into the n-well (212) in the PMOS transistor region (208) to a depth between 20 and 40 nanometers.

Continuing to refer to FIG. 2B, NMOS gate sidewall spacers (240) are formed on lateral surfaces of the NMOS offset spacers (232), typically by deposition of one or more conformal layers of silicon nitride and/or silicon dioxide on an existing top surface of the IC (200), followed by removal of the conformal layer material from the top surface of the NMOS fill metal gate (268) and the top surface of the p-well (210) by known anisotropic etching methods, leaving the conformal layer material on the lateral surfaces of the NMOS offset spacers (232). A lateral thickness of the NMOS gate sidewall spacers (240) is preferably between 40 and 100 nanometers thick at the top surface of the p-well (210). PMOS gate sidewall spacers (242) are formed on lateral surfaces of the PMOS offset spacers (234), also typically by deposition of one or more conformal layers of silicon nitride and/or silicon dioxide on an existing top surface of the IC (200), followed by removal of the conformal layer material from the top surface of the PMOS fill metal gate (270) and the top surface of the n-well (212) by known anisotropic etching methods, leaving the conformal layer material on the lateral surfaces of the PMOS offset spacers (234). A lateral thickness of the PMOS gate sidewall spacers (242) is preferably between 40 and 100 nanometers thick at the top surface of the n-well (212). The thickness of the NMOS gate sidewall spacers (240) is not necessarily substantially equal to the thickness of the PMOS gate sidewall spacers (242). A portion of the NMOS gate sidewall spacers (240) and a portion of the PMOS gate sidewall spacers (242) may be formed concurrently. NSD regions (244) are formed in the p-well (210) abutting the NLDD regions (236) adjacent to the NMOS gate sidewall spacers (240) by ion implanting an NSD set of n-type dopants into the p-well (210) in the NMOS transistor region (206) to a depth between 30 and 100 nanometers. PSD regions (246) are formed in the n-well (212) abutting the PLDD regions (238) adjacent to the PMOS gate sidewall spacers (242) by ion implanting a PSD set of p-type dopants into the n-well (212) in the PMOS transistor region (208) to a depth between 30 and 100 nanometers. Fabrication of the IC (200) is continued using known fabrication practices.

Figure 2C:
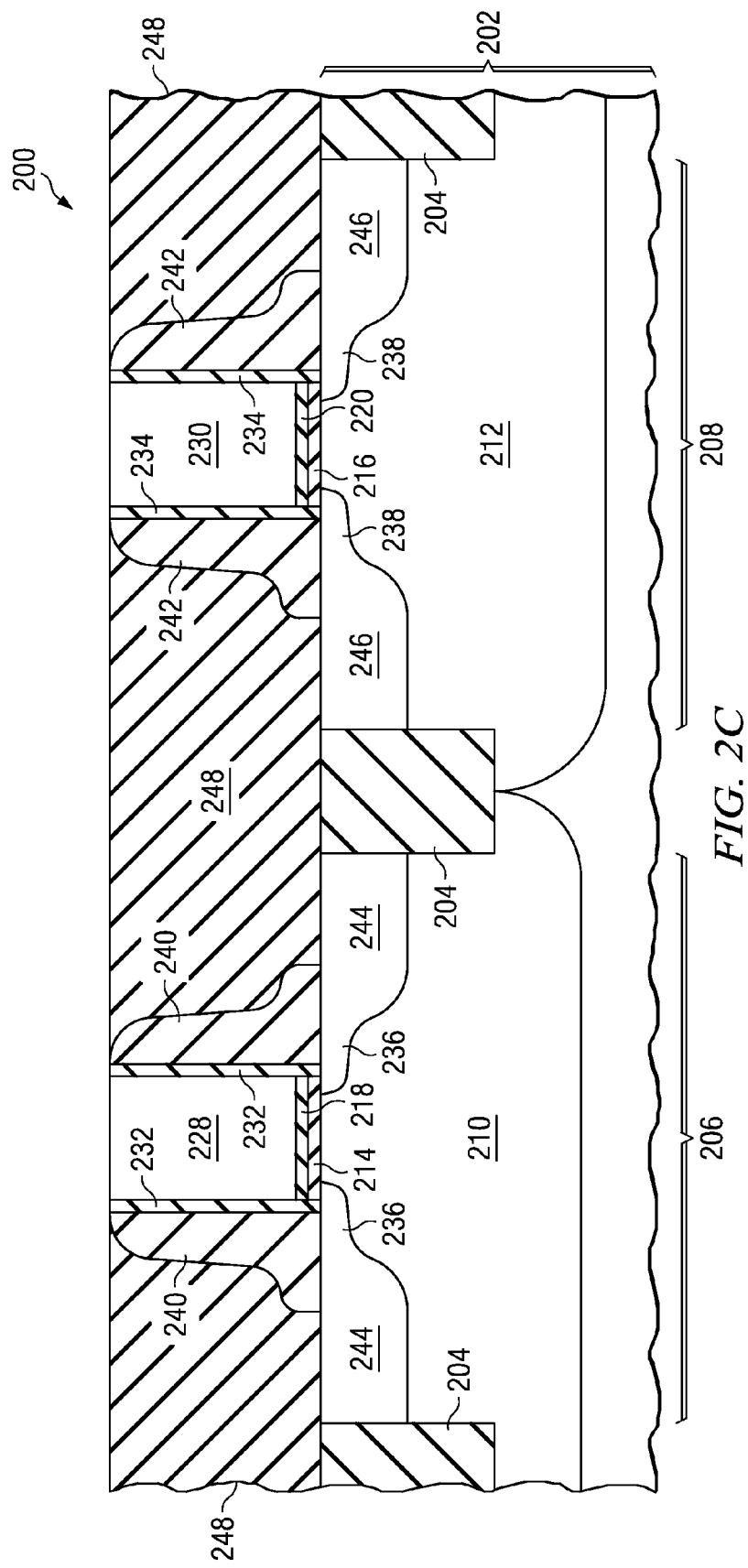

FIG. 2C depicts the IC (200) after formation of an oxide fill layer (248) on the top surfaces of the p-well (210) and the n-well (212). The oxide fill layer (248) may be formed by depositing a silicon dioxide layer on the IC (200), for example by spinning a layer of methylsilsesquioxane (MSQ) and solvent on the IC (200) and evaporating a majority of the solvent, followed by a chemical mechanical polish (CMP) process which removes silicon dioxide from top surfaces of the NMOS polysilicon gate (228) and the PMOS polysilicon gate (230). Other methods of forming the oxide fill layer (248) are within the scope of the instant invention.

Figure 2D:
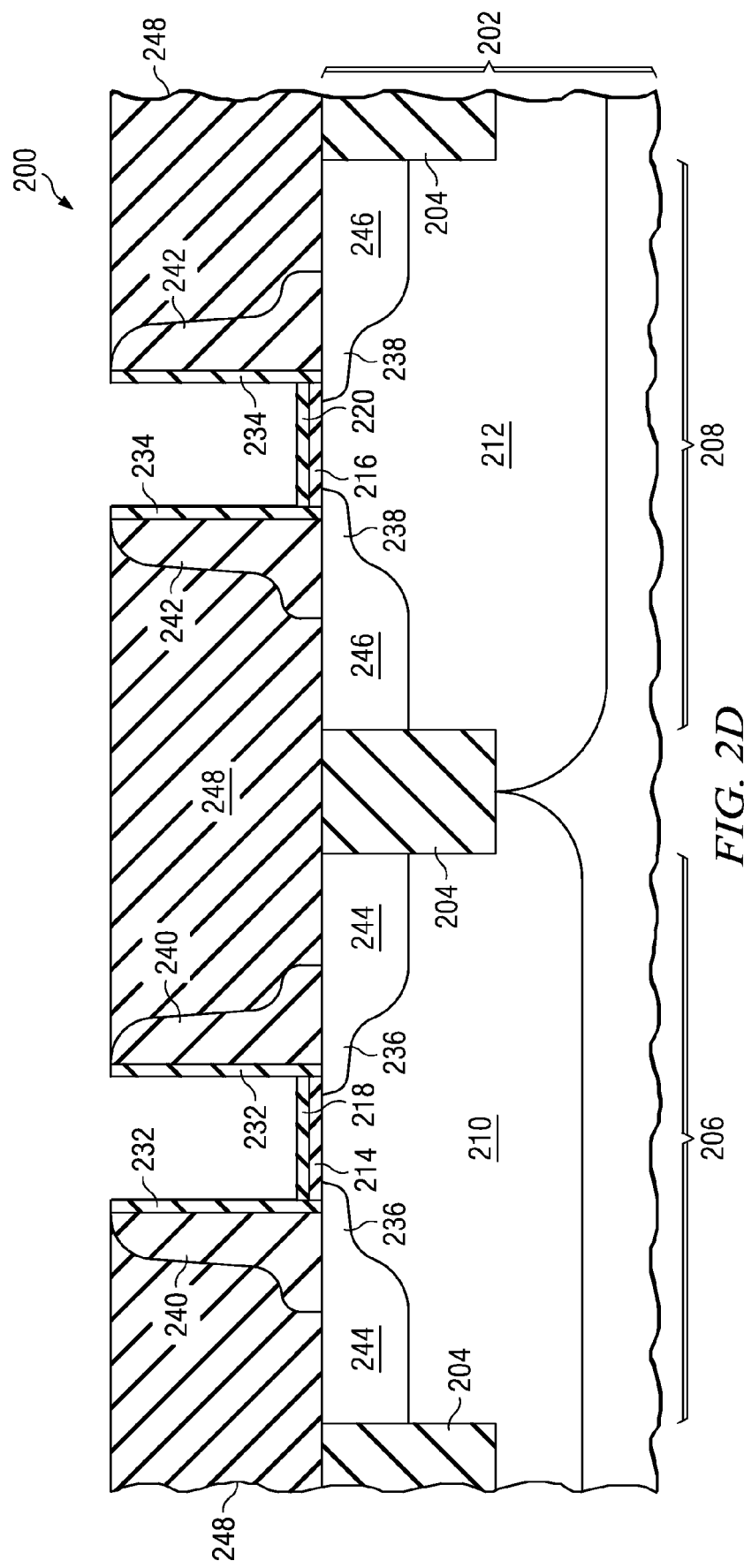

FIG. 2D depicts the IC after removal of the NMOS polysilicon gate (228) and the PMOS polysilicon gate (230). In a preferred embodiment, substantially all the polysilicon over the NMOS gate dielectric layer (214) and over the PMOS gate dielectric layer (216) is etched away while a majority of offset spacer material in the NMOS offset spacers (232) and the PMOS offset spacers (234) remains. The polysilicon may be etched by a reactive ion etch process, for example using a fluorine containing plasma, or by a wet etch process, for example using a choline containing etch solution.

Figure 2E:
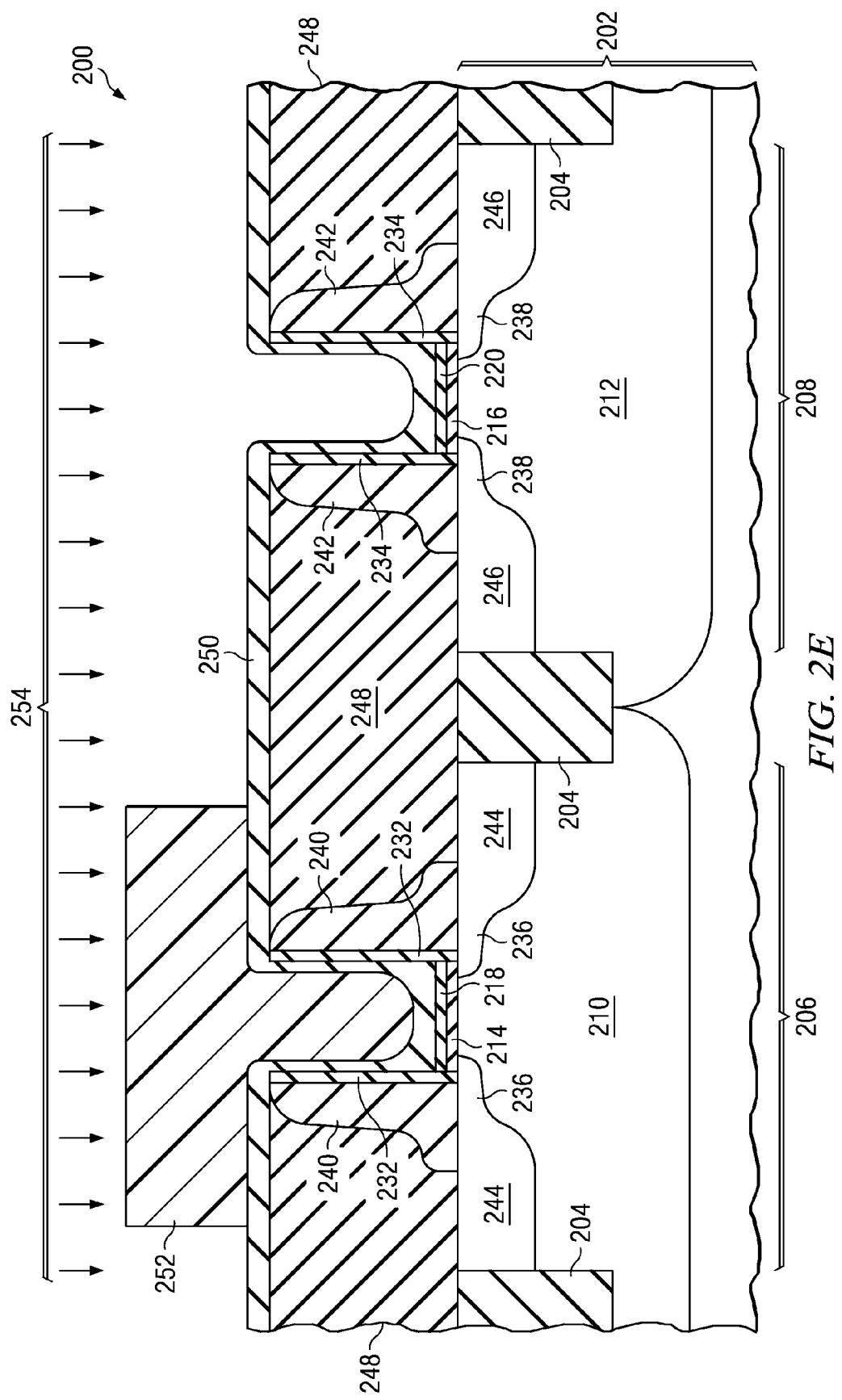

FIG. 2E depicts the IC (100) during formation of an NMOS metal gate. An NMOS metal gate layer (250), possibly titanium nitride or tantalum silicon nitride, preferably between 1 and 10 nanometers thick, is formed on an existing top surface of the IC (100), and particularly on the top surface of the optional NMOS nitrogen containing barrier layer (218), if present, or on the top surface of the NMOS gate dielectric layer (214). An NMOS metal gate layer photoresist pattern (252) is formed on a top surface of the NMOS metal gate layer (250) to define an area for the NMOS metal gate in the NMOS region (206). A NMOS metal gate layer reactive ion etch process (254), for example a plasma containing halogens such as fluorine or chlorine, removes unwanted NMOS metal gate material from areas exposed by the NMOS metal gate layer photoresist pattern (124), in particular the PMOS transistor region (208). In a preferred embodiment, substantially all the unwanted NMOS metal gate material is removed from areas exposed by the NMOS metal gate layer photoresist pattern (252) and substantially none of the PMOS nitrogen containing barrier layer (220) is removed by the NMOS metal gate layer reactive ion etch process (254). The NMOS metal gate layer photoresist pattern (252) is removed in subsequent processing, for example by exposing the IC (200) to an oxygen containing plasma, followed by a wet cleanup to remove any organic residue from the top surface of the NMOS metal gate layer (250).

Figure 2F:
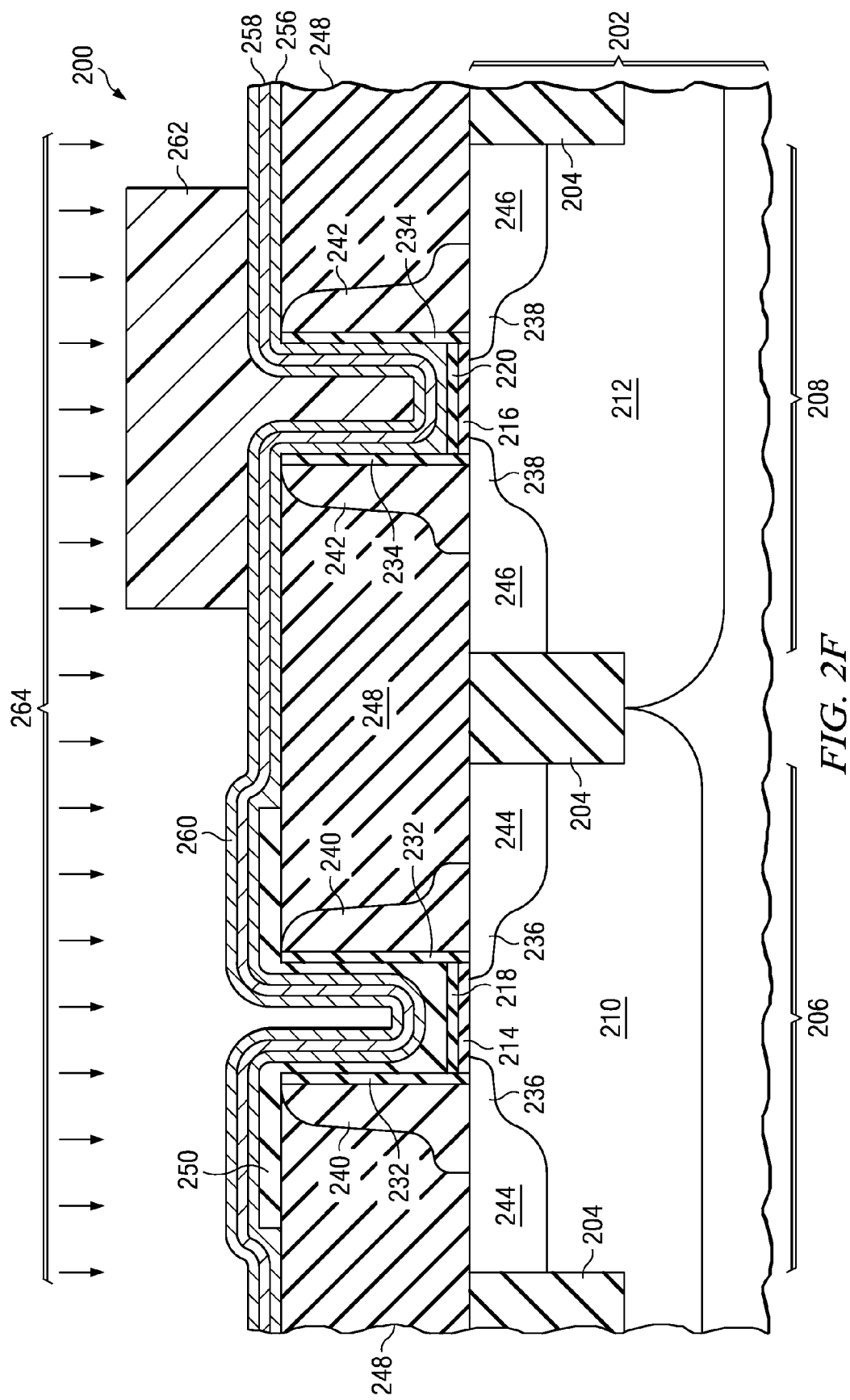

FIG. 2F depicts the IC (200) during formation of a PMOS metal gate stack. A PMOS low oxygen metal layer (256) is formed on an existing top surface of the IC (200) and particularly on the top surface of the PMOS nitrogen containing barrier layer (220). The PMOS low oxygen metal layer (256) is preferably formed of a metal or a mixture of metals with a work function greater than 5 electron volts, as described in reference to FIG. 1C. An oxygen concentration in the PMOS low oxygen metal layer (256) is below 2 percent, and is preferably below 1 percent. The PMOS low oxygen metal layer (256) is preferably between 0.5 and 2 nanometers thick, and is preferably formed by ALD processes, but may be formed by PVD, MOCVD or other deposition processes. A PMOS oxygen rich metal layer (258), as described in reference to FIG. 1D, is formed on a top surface of the PMOS low oxygen metal layer (256). The PMOS oxygen rich metal layer (258) may be formed by depositing an oxygen rich layer of metal on the top surface of the PMOS low oxygen metal layer (256) or may be formed by oxidizing a top region of the PMOS low oxygen metal layer (256). In a preferred embodiment, an oxygen concentration in the PMOS oxygen rich metal layer (258) is greater than 20 percent, but may be as low as 10 percent. In a preferred embodiment, a thickness of the PMOS oxygen rich metal layer (258) is between 0.5 and 2 nanometers. A PMOS top metal gate layer (260), preferably of a same composition as the PMOS low oxygen metal layer (256), but possibly another metal or mixture of metals with a work function greater than 5 electron volts, is formed on a top surface of the PMOS oxygen rich metal layer (258). The PMOS top metal gate layer (260) is preferably formed by ALD processes, but may be formed by PVD, MOCVD or other deposition processes. In a preferred embodiment, a thickness of the PMOS top metal gate layer (260) is between 0.5 and 2 nanometers. A PMOS metal gate stack photoresist pattern (262) is formed on a top surface of the PMOS top metal gate layer (260) to define an area for the PMOS metal gate stack in the PMOS region (208). A PMOS metal gate stack reactive ion etch process (264) removes unwanted material from the PMOS top metal gate layer (260), the PMOS oxygen rich metal layer (258) and the PMOS low oxygen metal layer (256). In a preferred embodiment, the PMOS metal gate stack reactive ion etch process (264) includes three reactive ion etch steps in which gas species, RF power and other process parameters in each step are adjusted to provide clean removal of the PMOS top metal gate layer (260), the PMOS oxygen rich metal layer (258) and the PMOS low oxygen metal layer (256). In a preferred embodiment, substantially all the unwanted PMOS metal gate stack material is removed from areas exposed by the PMOS metal gate stack photoresist pattern (262) and substantially none of the NMOS metal gate layer (250) is removed by the PMOS metal gate stack reactive ion etch process (264). The PMOS metal gate stack photoresist pattern (262) is removed in subsequent processing, for example by exposing the IC (200) to an oxygen containing plasma, followed by a wet cleanup to remove any organic residue from the top surface of the PMOS top metal gate layer (260).

Figure 2G:
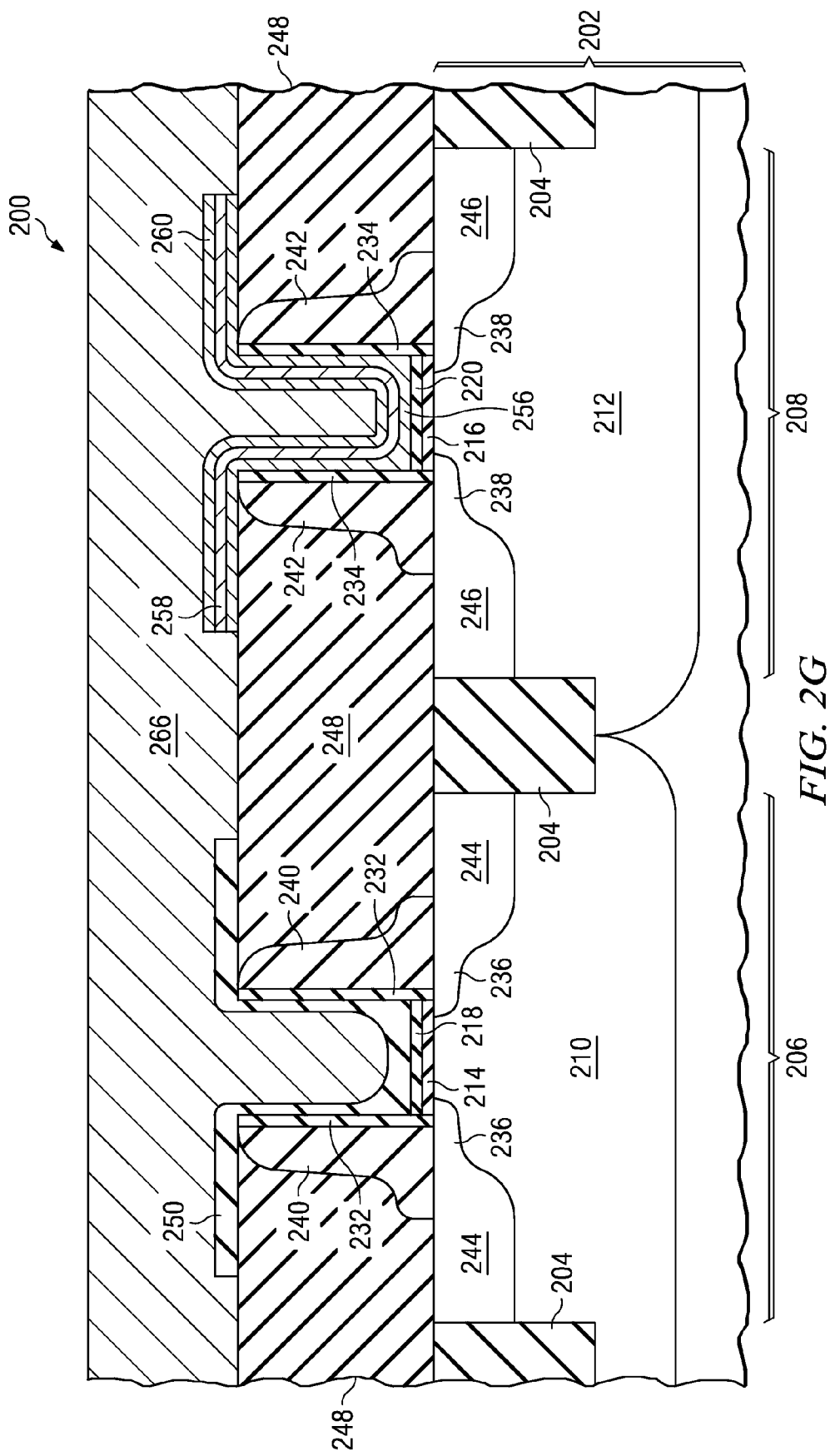

FIG. 2G depicts the IC (200) after a layer of gate fill metal (266) is formed on an existing top surface of the IC (200), particularly in gate cavities between the NMOS offset spacers (232) and PMOS offset spacers (234). The gate fill metal (266) is preferably aluminum or tungsten, but may be any metal with appropriately low electrical resistivity for a desired performance level of the IC (200). In a preferred embodiment, the gate cavities between the NMOS offset spacers (232) and PMOS offset spacers (234) are completely filled with the gate fill metal (266) such that no voids are present in the gate cavities.

Figure 2H:
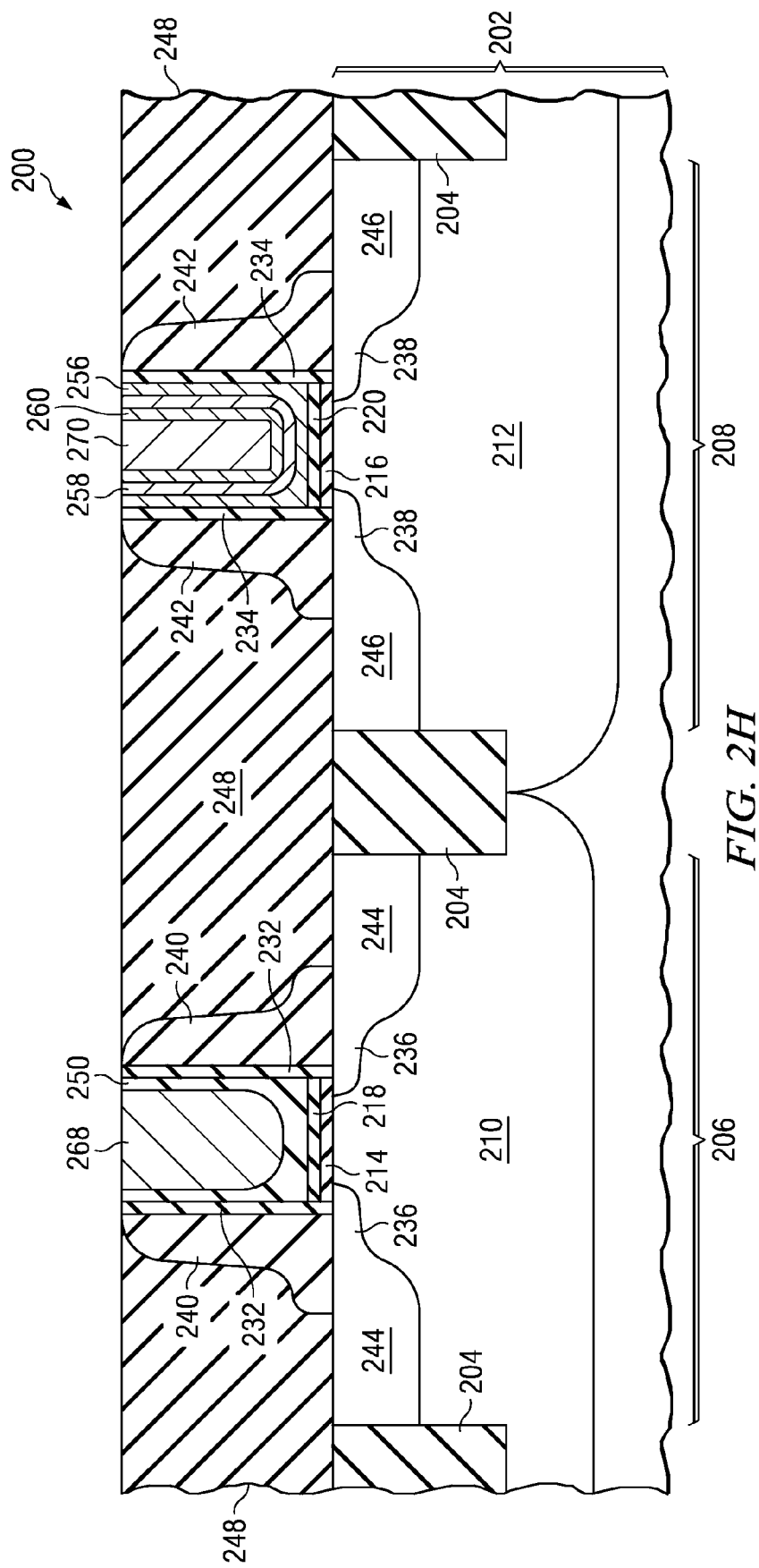

FIG. 2H depicts the IC (200) after a gate planarizing process which removes gate fill metal from a top surface of the oxide fill layer (248), leaving an NMOS fill metal gate (268) in the gate cavity between the NMOS offset spacers (232) and leaving a PMOS fill metal gate (270) in the gate cavity between the PMOS offset spacers (234). The gate fill metal may be removed by an etchback process, for example an isotropic reactive ion etch process including a halogen containing plasma, a CMP process, or other metal planarizing process. In a preferred embodiment, a top surface of the NMOS fill metal gate (268) and a top surface of the PMOS fill metal gate (270) are essentially coplanar with the top surface of the oxide fill layer (248) after the gate planarizing process is completed.

The PMOS nitrogen containing barrier layer (220) desirably reduces oxygen diffusion between the PMOS metal gate layers (244, 246, 248) and the PMOS gate dielectric layer (216), which may improve on-state drive current, especially if the PMOS gate dielectric layer (216) is thinner than 2 nanometers. An oxygen concentration in the PMOS low oxygen metal layer (256) below 2 percent also desirably reduces oxygen diffusion between the PMOS metal gate layers (244, 246, 248) and the PMOS gate dielectric layer (216). An oxygen concentration in the PMOS oxygen rich metal layer (258) above 10 percent desirably increases a work function of the PMOS metal gate layers (244, 246, 248) by 200 to 300 0.2 to 0.3 electron volts.

The embodiment discussed in reference to FIG. 2A through FIG. 2H is advantageous because the processes to form the inventive PMOS gate stack may be integrated into a gate replacement fabrication process sequence of the IC (200) using conventional semiconductor processing equipment.

Figure 3:
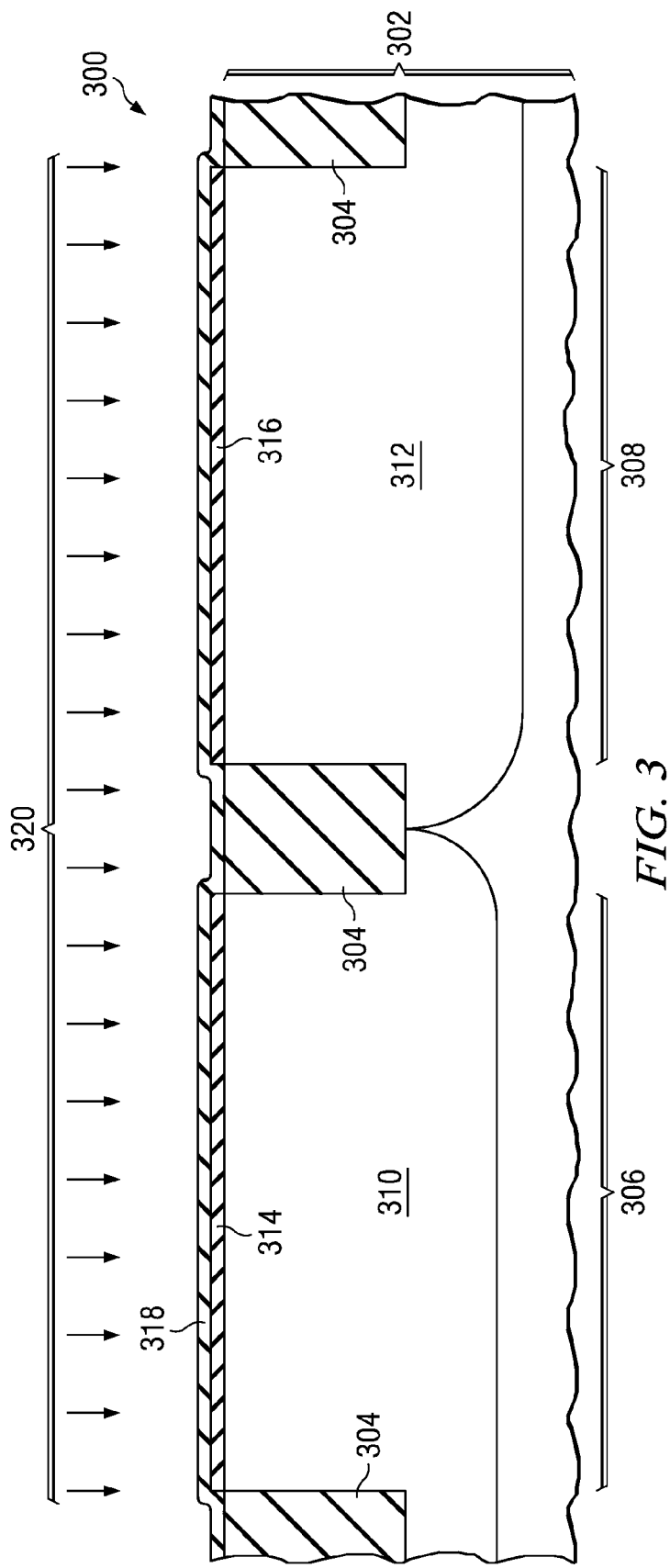
FIG. 3 depicts formation of a nitrogen containing barrier on an IC according to an embodiment of the instant invention.

FIG. 3 depicts formation of a nitrogen containing barrier on an IC according to an embodiment of the instant invention. The IC (300) is formed on a substrate (302) which has the properties described in reference to FIG. 1A. Elements of field isolation (304) are formed in the substrate (302) as described in reference to FIG. 1A. An element of field isolation (304) separates a region in the IC (300) defined for an NMOS transistor (306) from a region in the IC (300) defined for a PMOS transistor (308). A p-well (310) is formed in the substrate (302) in the NMOS region (306), as described in reference to FIG. 1A. Similarly, an n-well (312) is formed in the substrate (302) in the PMOS region (308), as described in reference to FIG. 1A. An NMOS gate dielectric layer (314) is formed on a top surface of the p-well (310), with the properties described in reference to FIG. 1A. A PMOS gate dielectric layer (316) is formed on a top surface of the n-well (312), with the properties described in reference to FIG. 1A. A nitrogen containing barrier layer (318) is formed on a top surface of the NMOS gate dielectric layer (314) and a top surface of the PMOS gate dielectric layer (316) by a nitrogen containing barrier deposition process (320). In one embodiment, the barrier deposition process (320) may be a chemical vapor deposition (CVD) process, for example exposing the IC (300) to $NH_3$ and $SiH_4$ gases at a total pressure between 1 and 760 torr at a temperature between 300 C and 800 C. Another example of a CVD embodiment of the barrier deposition process (320) includes exposing the IC (300) to $NH_3$ and $Si_2H_6$ gases at a total pressure between 1 and 760 torr at a temperature between 300 C and 800 C. A third example of a CVD embodiment of the barrier deposition process (320) includes exposing the IC (300) to $NH_3$ and bis (tertiary-butylamino) silane (BTBAS) gases at a total pressure between 1 and 760 torr at a temperature between 300 C and 800 C. In another embodiment, the barrier deposition process (320) may be a PVD process, for example sputtering from a silicon target in a nitrogen gas ambient at a total pressure between 1 and 500 millitorr at a temperature below 200 C. In a further embodiment, the barrier deposition process (320) may be an ALD process, for example exposing the IC (300) to $NH_3$ and silicon tetrakis dimethylamide (TDMAS) at a total pressure between 1 and 500 millitorr at a temperature between 100 C and 350 C. In a preferred embodiment, the nitrogen containing barrier layer (318) is between 0.3 and 0.5 nanometers thick.

The embodiment discussed in reference to FIG. 3 is advantageous because forming the nitrogen containing barrier layer (318) by a deposition process may provide a stronger barrier to oxygen diffusion than a nitrogen containing barrier layer formed by other means.

Figure 4A:
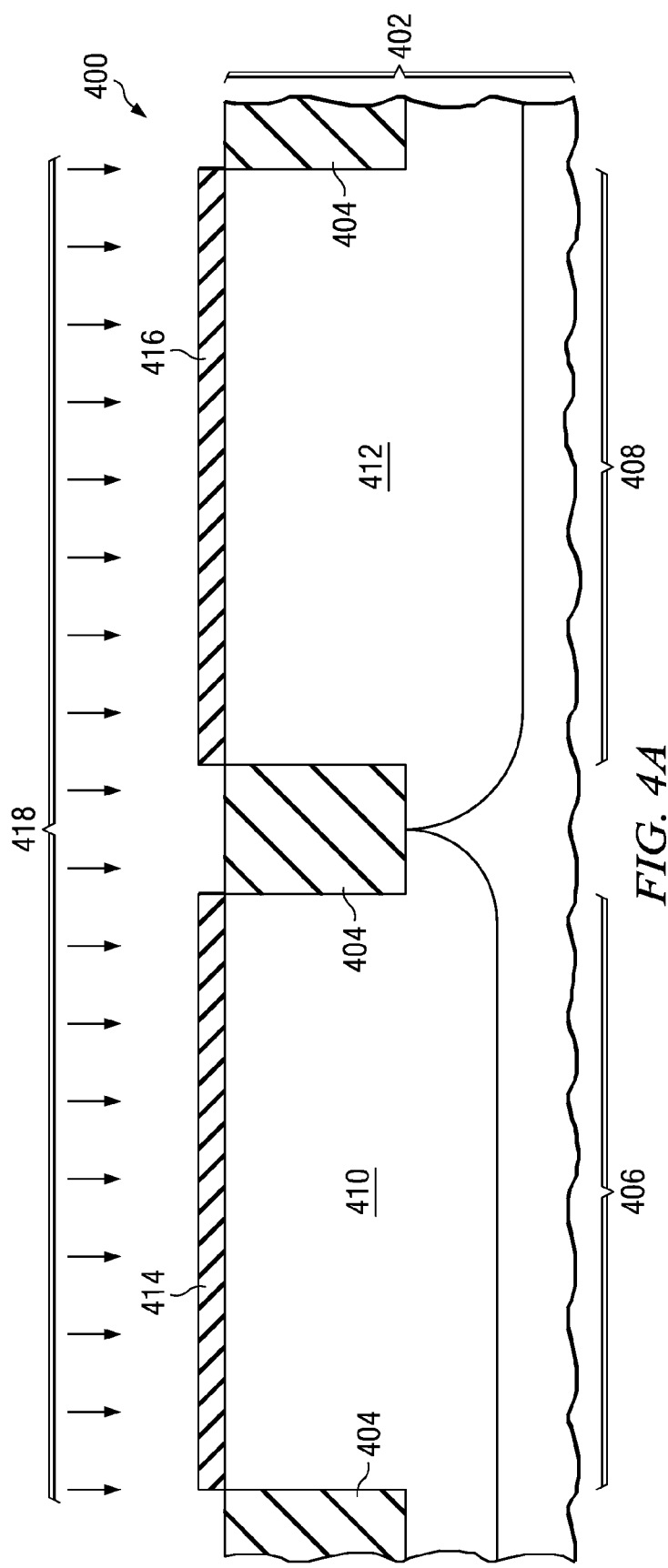
FIG. 4A and FIG. 4B depict formation of a nitrogen containing barrier on an IC according to an alternate embodiment of the instant invention.
Figure 4B:
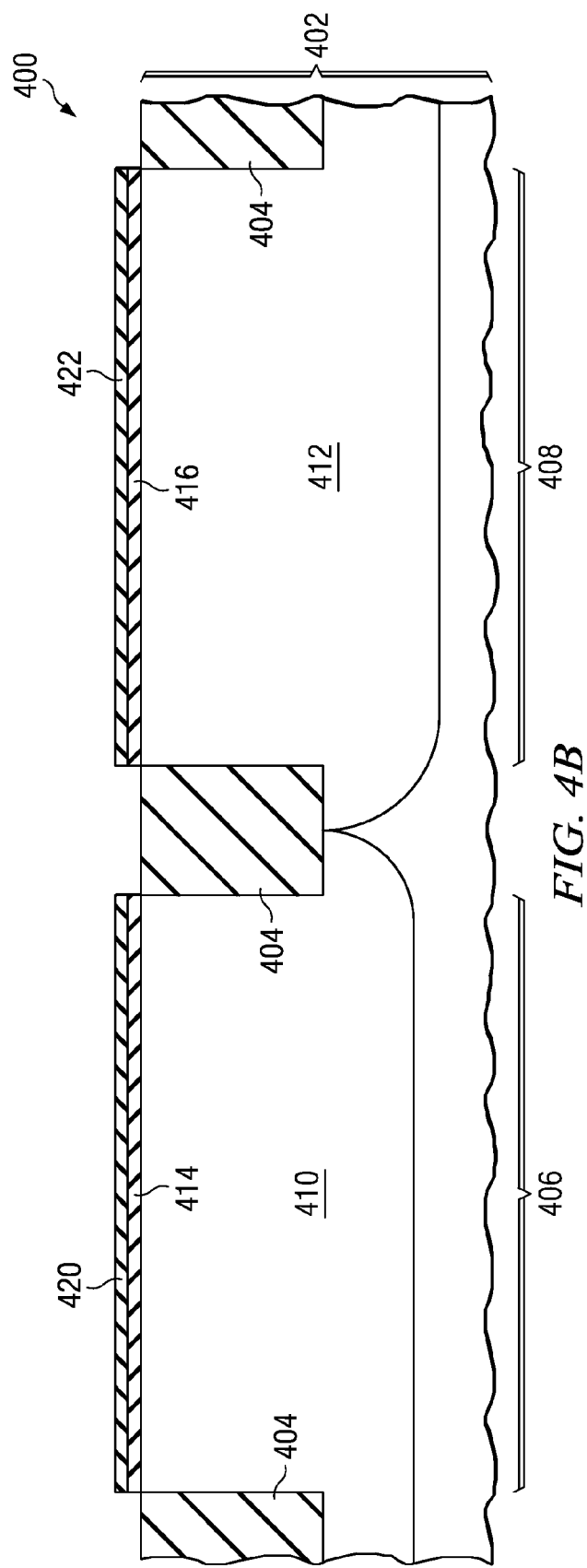

FIG. 4A and FIG. 4B depict formation of a nitrogen containing barrier on an IC according to an alternate embodiment of the instant invention. Referring to FIG. 4A, the IC (400) is formed on a substrate (402) which has the properties described in reference to FIG. 1A. Elements of field isolation (404) are formed in the substrate (402) as described in reference to FIG. 1A. An element of field isolation (404) separates a region in the IC (400) defined for an NMOS transistor (406) from a region in the IC (400) defined for a PMOS transistor (408). A p-well (410) is formed in the substrate (402) in the NMOS region (406), as described in reference to FIG. 1A. Similarly, an n-well (412) is formed in the substrate (402) in the PMOS region (408), as described in reference to FIG. 1A. An NMOS gate dielectric layer (414) is formed on a top surface of the p-well (410), with the properties described in reference to FIG. 1A. A PMOS gate dielectric layer (416) is formed on a top surface of the n-well (412), with the properties described in reference to FIG. 1A. A barrier nitridation process (418) is performed on a top surface of the NMOS gate dielectric layer (414) and a top surface of the PMOS gate dielectric layer (416) which adds nitrogen to a top region of the NMOS gate dielectric layer (414) and a top region of the PMOS gate dielectric layer (416). In one embodiment, the barrier nitridation process (418) may be a first plasma process in which an existing top surface of the IC (400) is exposed to a plasma formed by providing between 500 and 2500 watts of radio frequency (RF) power to a mixture of argon gas and nitrogen gas with an argon to nitrogen ratio between 50 to 1 and 200 to 1, at a total pressure between 100 and 300 millitorr, at a temperature between 200 C and 400 C. In another embodiment, the barrier nitridation process (418) may be a second plasma process in which an existing top surface of the IC (400) is exposed to a plasma formed by providing between 250 to 1500 watts of RF power to nitrogen gas at a pressure between 5 and 30 millitorr, at a temperature between 30 C and 150 C. In a further embodiment, the barrier nitridation process (418) may be a thermal process in which an existing top surface of the IC (400) is exposed to $NH_3$ gas at a pressure between 500 and 760 torr at a temperature between 700 C and 900 C.

Referring to FIG. 4B, an NMOS nitrogen containing barrier layer (420) is formed in the top region of the NMOS gate dielectric layer (414) and a PMOS nitrogen containing barrier layer (422) is formed in the top region of the PMOS gate dielectric layer (416) by the barrier nitridation process. In a preferred embodiment, a thickness of the PMOS nitrogen containing barrier layer (422) is between 0.3 and 0.5 nanometers.

The embodiment discussed in reference to FIG. 4A and FIG. 4B is advantageous because forming the PMOS nitrogen containing barrier layer (422) by a nitridation process may provide desirably fewer interface traps than a nitrogen containing barrier layer formed by other means.

Figure 5A:
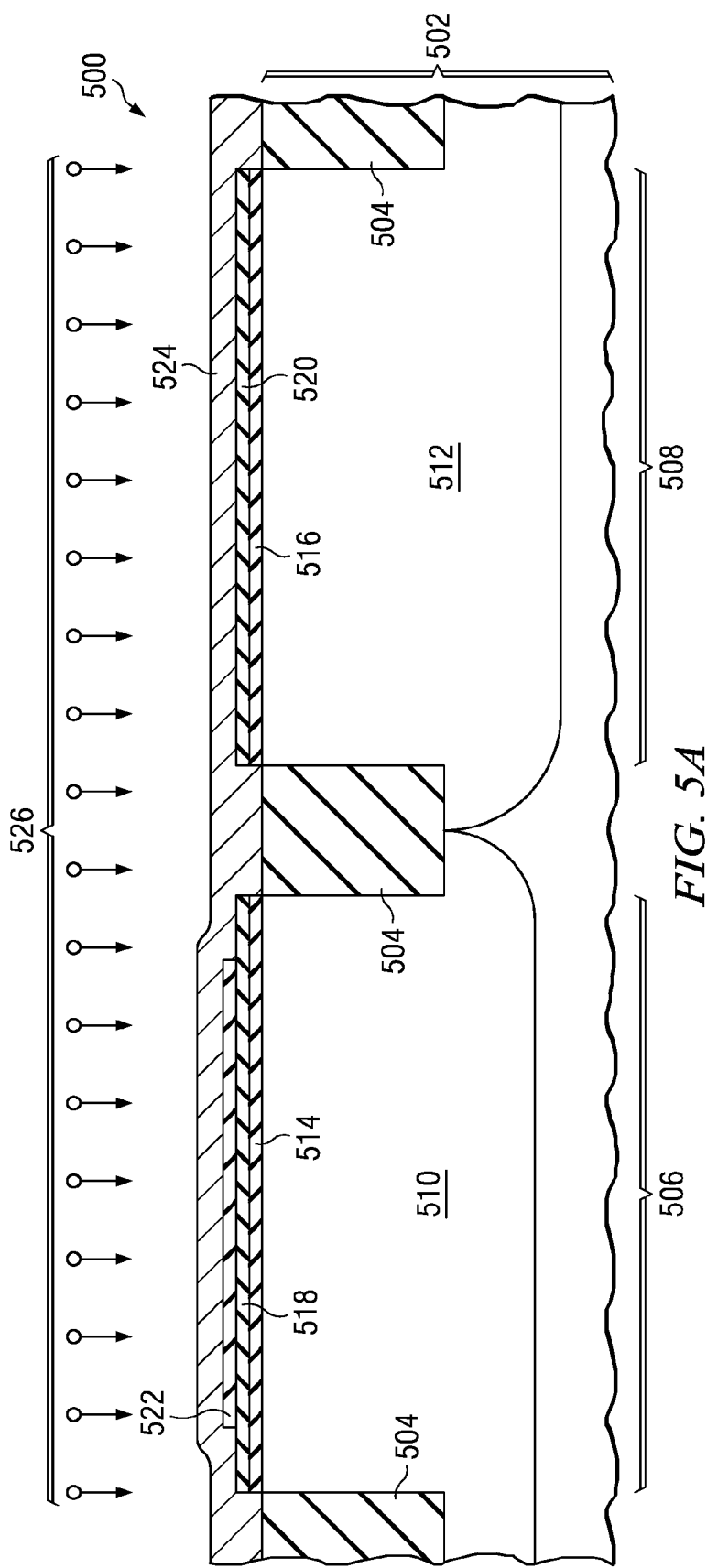
FIG. 5A through FIG. 5C depict formation of a PMOS metal gate stack on an IC according to one embodiment of the instant invention.
Figure 5B:
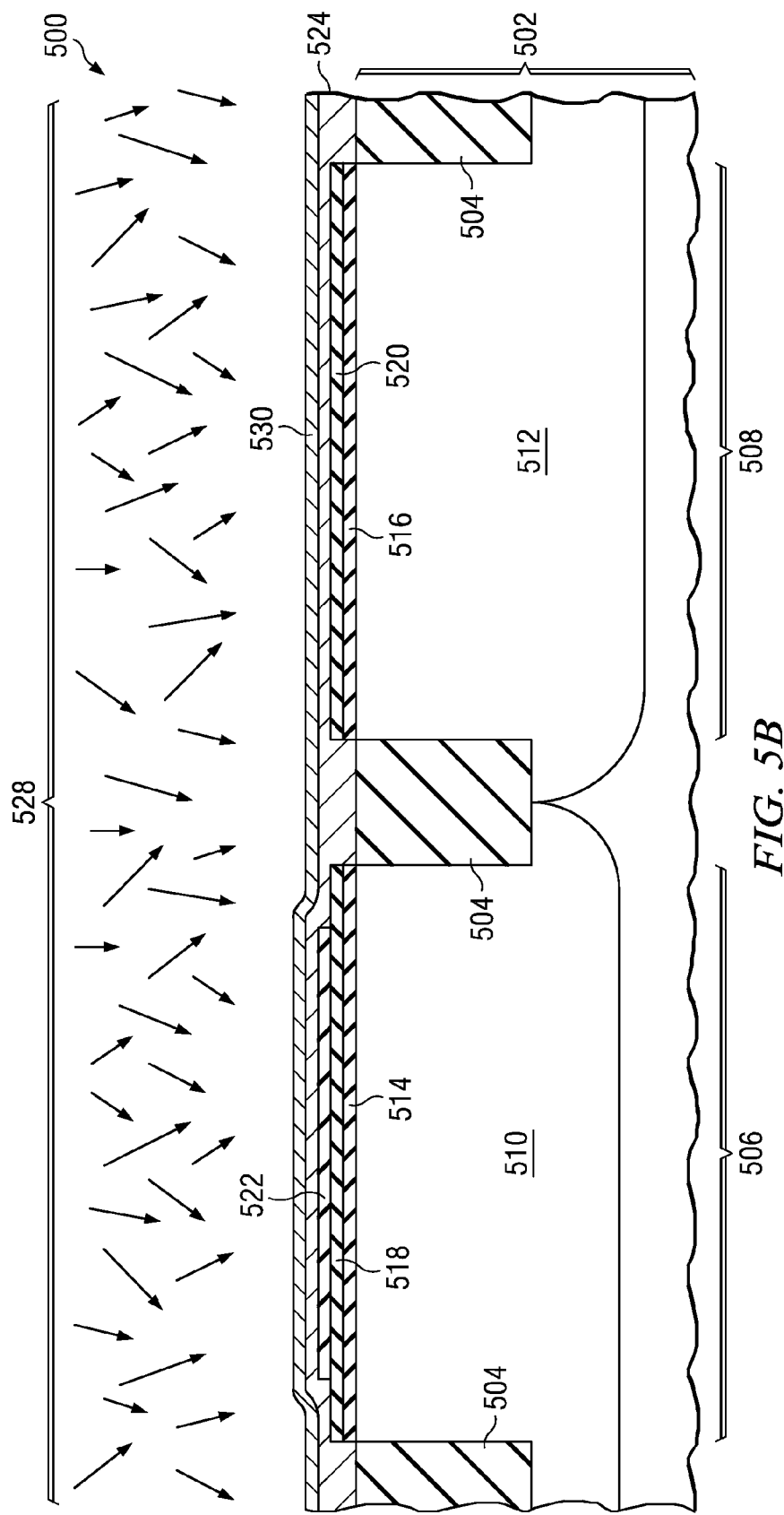
Figure 5C:
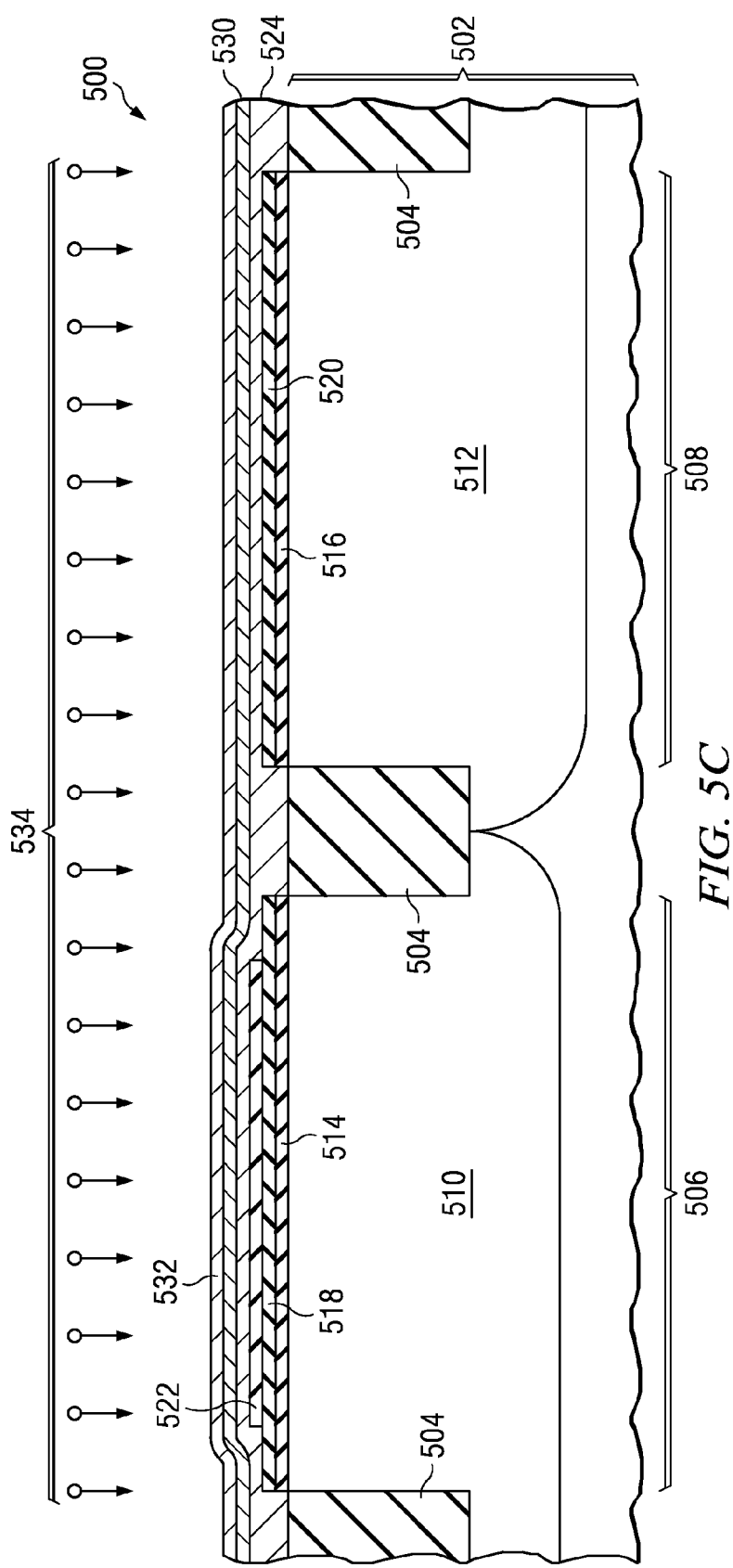

FIG. 5A through FIG. 5C depict formation of a PMOS metal gate stack on an IC according to one embodiment of the instant invention. Referring to FIG. 5A, the IC (500) is formed on a substrate (502) which has the properties described in reference to FIG. 1A. Elements of field isolation (504) are formed in the substrate (502) as described in reference to FIG. 1A. An element of field isolation (504) separates a region in the IC (500) defined for an NMOS transistor (506) from a region in the IC (500) defined for a PMOS transistor (508). A p-well (510) is formed in the substrate (502) in the NMOS region (506), as described in reference to FIG. 1A. Similarly, an n-well (512) is formed in the substrate (502) in the PMOS region (508), as described in reference to FIG. 1A. An NMOS gate dielectric layer (514) is formed on a top surface of the p-well (510), with the properties described in reference to FIG. 1A. A PMOS gate dielectric layer (516) is formed on a top surface of the n-well (512), with the properties described in reference to FIG. 1A. An NMOS nitrogen containing barrier layer (518) is formed in the top region of the NMOS gate dielectric layer (514) and a PMOS nitrogen containing barrier layer (520) is formed in the top region of the PMOS gate dielectric layer (516), by a process as described in reference to FIG. 3 or as described in reference to FIG. 4A and FIG. 4B. An NMOS metal gate layer (522) is formed on a top surface of the NMOS nitrogen containing barrier layer (518), as described in reference to FIG. 1B. A PMOS low oxygen metal layer (524) is formed on a top surface of the PMOS nitrogen containing barrier layer (520) and a top surface of the NMOS metal gate layer (522), of the materials described in reference to FIG. 1C, by a low oxygen metal deposition process (526). In a preferred embodiment, the low oxygen metal deposition process (526) may be an ALD process, for example exposing the IC (500) to a metal precursor gas such as $WCl_4$ at a total pressure between 1 and 500 millitorr at a temperature between 100 C and 350 C. In an alternate embodiment, the low oxygen metal deposition process (526) may be a CVD process, for example exposing the IC (500) to a metal precursor gas such as $WF_6$ at a total pressure between 1 and 760 torr at a temperature between 300 C and 800 C. In a further embodiment, the low oxygen metal deposition process (526) may be a PVD process, for example sputtering a metal such as palladium, tungsten, molybdenum, ruthenium, nickel and/or iridium from a metal target in an argon ambient at a total pressure between 1 and 500 millitorr at a temperature between 30 C and 200 C. In a preferred embodiment, the PMOS low oxygen metal layer (524) is between 1 and 4 nanometers thick, as deposited.

Referring to FIG. 5B, a gate metal oxidation process (528) is performed on the IC (500) which infuses oxygen into a top region of the PMOS low oxygen metal layer (524) to form a PMOS oxygen rich metal layer (530). In a preferred embodiment of the gate metal oxidation process (528), the PMOS oxygen rich metal layer (530) extends from a top surface of the PMOS low oxygen metal layer (524) to a depth between 0.5 and 2 nanometers and is provided an oxygen concentration greater than 20 percent, but other embodiments may provide an oxygen concentration between 10 percent and 20 percent. In one embodiment of the instant invention, the gate metal oxidation process (528) may be an oxidizing plasma process, for example exposing the IC (500) to a plasma formed by providing between 1000 and 3000 watts of RF power to a mixture of argon gas and oxygen gas with an argon to oxygen ratio between 5 to 1 and 20 to 1, at a total pressure between 0.5 and 2 torr, at a temperature between 200 C and 400 C. In an alternate embodiment, the gate metal oxidation process (528) may be a thermal oxidation process, for example exposing the IC (500) to an ambient which includes oxygen and/or ozone at a total pressure between 1 and 760 torr at a temperature between 400 C and 800 C.

Referring to FIG. 5C, a PMOS top metal gate layer (532), preferably of a same composition as the PMOS low oxygen metal layer (524), but possibly another metal or mixture of metals with a work function greater than 5 electron volts, is formed on a top surface of the PMOS oxygen rich metal layer (530) by a top metal gate deposition process (534). The top metal gate deposition process (534) may be an ALD process as described in reference to FIG. 5A, a CVD process as described in reference to FIG. 5A, or a PVD process as described in reference to FIG. 5A. In a preferred embodiment, the PMOS top metal gate layer (532) is between 0.5 and 2 nanometers thick.

The embodiments discussed in reference to FIG. 5A through FIG. 5C are advantageous because the oxygen concentration in the PMOS oxygen rich metal layer (530) may be adjusted by varying an exposure time of the IC to the gate metal oxidation process (528) which desirably impacts a fabrication process sequence of the IC (500) less than other methods of forming the PMOS oxygen rich metal layer (530).

It will be recognized by workers familiar with gate replacement fabrication processes that the planar embodiments described in reference to FIG. 5A through FIG. 5C may be applied to gate replacement processes.

Figure 6A:
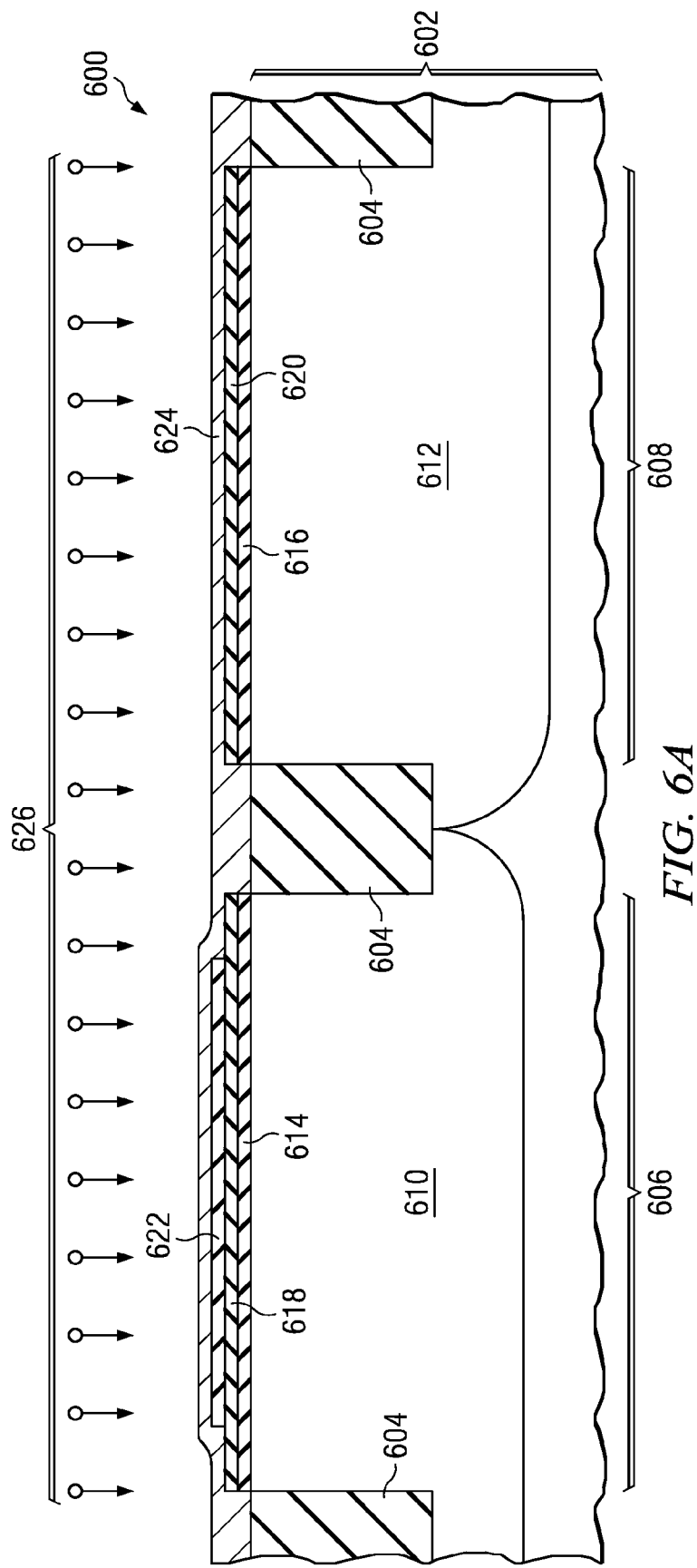
FIG. 6A through FIG. 6C depict formation of a PMOS metal gate stack on an IC according to an alternate embodiment of the instant invention.
Figure 6B:
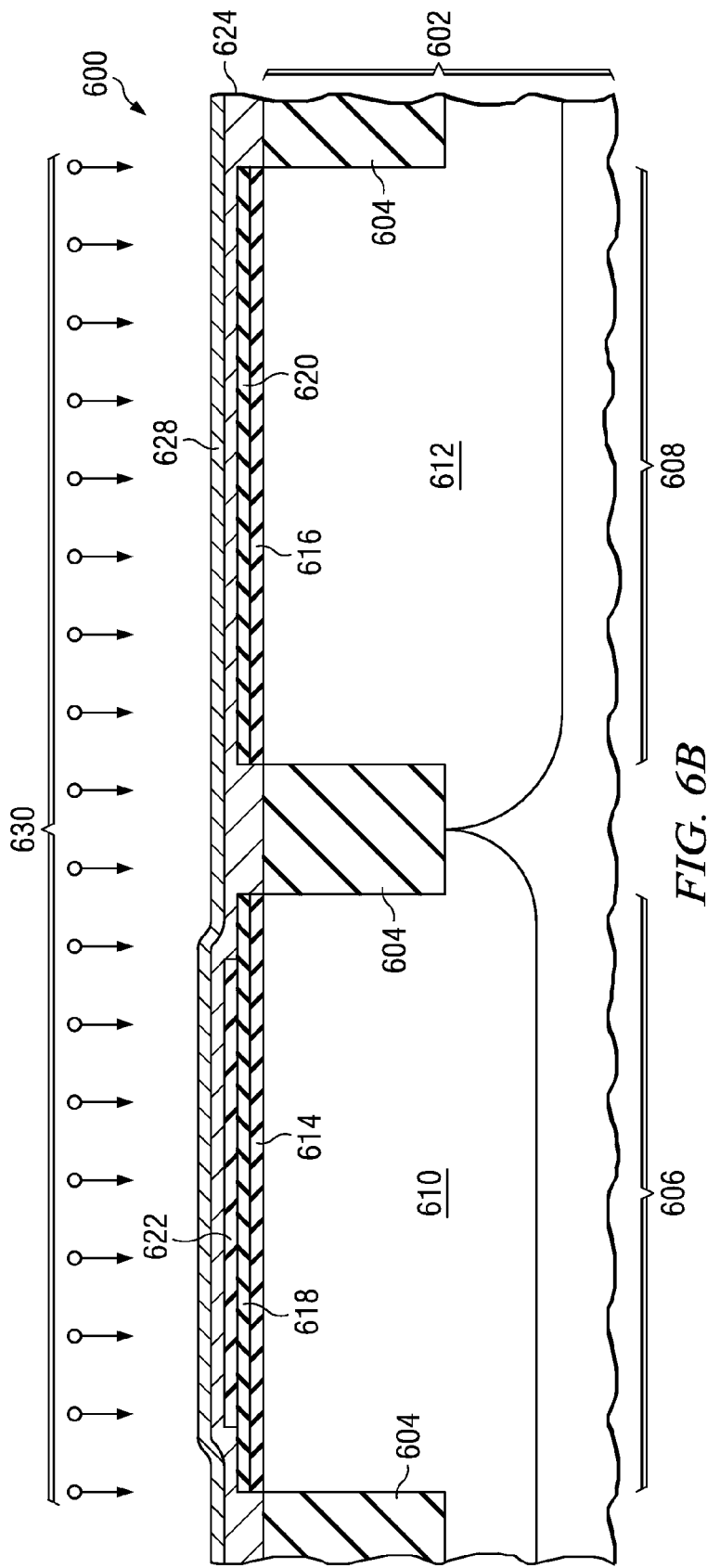
Figure 6C:
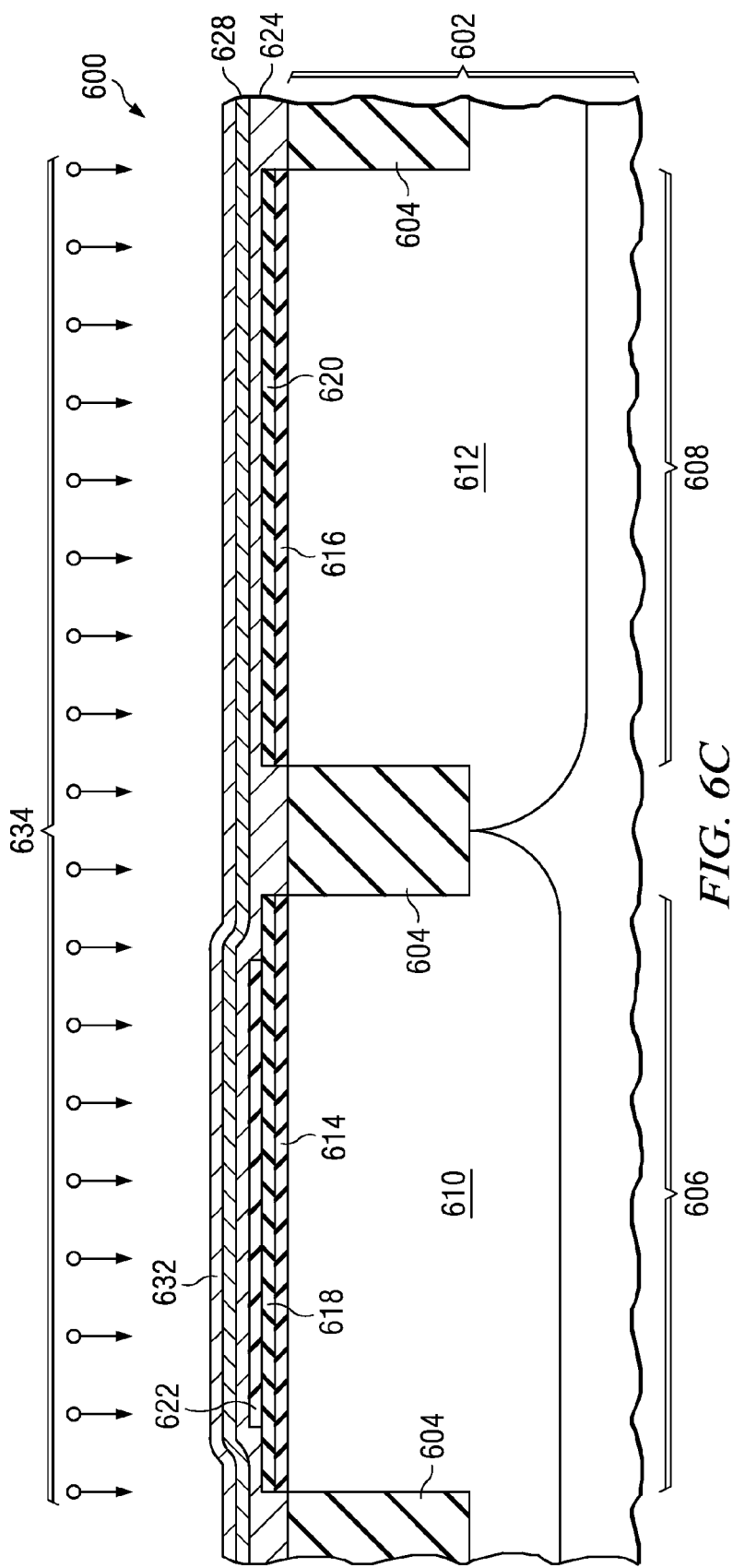

FIG. 6A through FIG. 6C depict formation of a PMOS metal gate stack on an IC according to an alternate embodiment of the instant invention. Referring to FIG. 6A, the IC (600) is formed on a substrate (602) which has the properties described in reference to FIG. 1A. Elements of field isolation (604) are formed in the substrate (602) as described in reference to FIG. 1A. An element of field isolation (604) separates a region in the IC (600) defined for an NMOS transistor (606) from a region in the IC (600) defined for a PMOS transistor (608). A p-well (610) is formed in the substrate (602) in the NMOS region (606), as described in reference to FIG. 1A. Similarly, an n-well (612) is formed in the substrate (602) in the PMOS region (608), as described in reference to FIG. 1A. An NMOS gate dielectric layer (614) is formed on a top surface of the p-well (610), with the properties described in reference to FIG. 1A. A PMOS gate dielectric layer (616) is formed on a top surface of the n-well (612), with the properties described in reference to FIG. 1A. An NMOS nitrogen containing barrier layer (618) is formed in the top region of the NMOS gate dielectric layer (614) and a PMOS nitrogen containing barrier layer (620) is formed in the top region of the PMOS gate dielectric layer (616), by a process as described in reference to FIG. 3 or as described in reference to FIG. 4A and FIG. 4B. An NMOS metal gate layer (622) is formed on a top surface of the NMOS nitrogen containing barrier layer (618), as described in reference to FIG. 1B. A PMOS low oxygen metal layer (624) is formed on a top surface of the PMOS nitrogen containing barrier layer (620) and a top surface of the NMOS metal gate layer (622), of the materials described in reference to FIG. 1C, by a low oxygen metal deposition process (626) as described in reference to FIG. 5A. In a preferred embodiment, the PMOS low oxygen metal layer (624) is between 0.5 and 2 nanometers thick, as deposited.

Referring to FIG. 6B, a PMOS oxygen rich metal layer (628) is deposited on a top surface of the PMOS low oxygen metal layer (624) by an oxygen rich metal deposition process (630). In a preferred embodiment, the PMOS oxygen rich metal layer (628) is between 0.5 and 2 nanometers thick and has an oxygen concentration greater than 20 percent, but in other embodiments may have an oxygen concentration between 10 percent and 20 percent. In a preferred embodiment of the instant invention, the oxygen rich metal deposition process (630) may be an ALD process, for example exposing the IC (600) to a mixture of a metal precursor gas such as $WCl_4$ and an oxidizing gas such as $H_2O$ vapor or ozone, at a total pressure between 1 and 500 millitorr, at a temperature between 100 C and 350 C. In an alternate embodiment of the instant invention, the oxygen rich metal deposition process (630) may be a CVD process, for example exposing the IC (600) to a mixture of a metal precursor gas such as $WF_6$ and an oxidizing gas such as oxygen or ozone, at a total pressure between 1 and 760 torr, at a temperature between 300 C and 800 C. In a further embodiment, the oxygen rich metal deposition process (630) may be a PVD process, for example sputtering a metal such as palladium, tungsten, molybdenum, ruthenium, nickel and/or iridium from a metal target in an oxygen ambient at a total pressure between 1 and 500 millitorr at a temperature between 30 C and 200 C.

Referring to FIG. 6C, a PMOS top metal gate layer (632), preferably of a same composition as the PMOS low oxygen metal layer (624), but possibly another metal or mixture of metals with a work function greater than 5 electron volts, is formed on a top surface of the PMOS oxygen rich metal layer (628) by a top metal gate deposition process (634). The top metal gate deposition process (634) may be an ALD process as described in reference to FIG. 5A, a CVD process as described in reference to FIG. 5A, or a PVD process as described in reference to FIG. 5A. In a preferred embodiment, the PMOS top metal gate layer (632) is between 0.5 and 2 nanometers thick.

The embodiments discussed in reference to FIG. 6A through FIG. 6C are advantageous because a thickness of the PMOS oxygen rich metal layer (628) may be adjusted more easily while maintaining a consistent oxygen concentration than in other methods of forming the PMOS oxygen rich metal layer (628).

It will be recognized by workers familiar with gate replacement fabrication processes that the planar embodiments described in reference to FIG. 6A through FIG. 6C may be applied to gate replacement processes.

What is claimed is:

1. An integrated circuit, comprising:
a PMOS transistor, further including:
a PMOS nitrogen containing barrier layer formed on a top surface of a PMOS gate dielectric layer;
a PMOS low oxygen metal layer with a work function greater than 5 electron volts and an oxygen concentration less than 2 percent, formed on a top surface of said PMOS nitrogen containing barrier layer;
a PMOS oxygen rich metal layer with a work function greater than 5 electron volts and an oxygen concentration greater then 10 percent, formed on a top surface of said PMOS low oxygen metal layer; and
a PMOS top metal layer with a work function greater than 5 electron volts, formed on a top surface of said PMOS oxygen rich metal layer; and
an n-channel metal oxide semiconductor (NMOS) transistor, further including a metal gate layer with a work function less than 5 electron volts and an oxygen concentration less than 2 percent, formed on a top surface of an NMOS gate dielectric layer.

2. The integrated circuit of claim 1, in which said PMOS nitrogen containing barrier layer is between 0.3 and 0.5 nanometers thick.

3. The integrated circuit of claim 1, in which said PMOS low oxygen metal layer is between 0.5 and 2 nanometers thick.

4. The integrated circuit of claim 1, in which PMOS oxygen rich metal layer is between 0.5 and 2 nanometers thick.

5. The integrated circuit of claim 1, in which said PMOS nitrogen containing barrier layer is a deposited layer with a different chemical composition than said PMOS gate dielectric layer.

6. The integrated circuit of claim 1, in which said PMOS nitrogen containing barrier layer is a top region of said PMOS gate dielectric layer to which nitrogen has been added.

7. The integrated circuit of claim 1, in which said PMOS oxygen rich metal layer is a deposited oxidized metal layer.

8. The integrated circuit of claim 1, in which said PMOS oxygen rich metal layer is a top region of said PMOS low oxygen metal layer to which oxygen has been added.

9. The integrated circuit of claim 1, in which said PMOS oxygen rich metal layer has an oxygen concentration greater than 20 percent.

* * * * *